United States Patent [19]

Lopetrone et al.

[11] Patent Number: 4,837,519

[45] Date of Patent: * Jun. 6, 1989

[54] FAULT DETECTION

[75] Inventors: Juan P. Lopetrone, Rancho Palos Verdes; Oliver Valdes, West Covina; James Clopton, Jr., Huntington Beach, all of Calif.

[73] Assignee: Southern California Edison Company, Rosemead, Calif.

[*] Notice: The portion of the term of this patent subsequent to Apr. 19, 2005 has been disclaimed.

[21] Appl. No.: 129,160

[22] Filed: Dec. 7, 1987

Related U.S. Application Data

[63] Continuation-in-part of Ser. No. 773,333, Sep. 6, 1985, and a continuation-in-part of Ser. No. 899,927, Aug. 25, 1986.

[51] Int. Cl.⁴ ............................................. G01R 31/08
[52] U.S. Cl. .................................. 324/529; 324/528
[58] Field of Search .............. 324/529, 509, 530, 528; 340/650

[56] References Cited

U.S. PATENT DOCUMENTS

| | | |
|---|---|---|
| 383,666 | 4/1888 | Shallenberger . |
| 405,572 | 3/1889 | Loomis . |
| 428,050 | 6/1890 | Macloskie . |
| 1,538,383 | 5/1925 | Bullard . |
| 2,989,694 | 3/1958 | Fath . |
| 3,800,214 | 3/1974 | O'Flynn . |
| 3,991,363 | 11/1976 | Lathrop . |
| 4,104,581 | 8/1978 | Arkosy . |
| 4,151,460 | 4/1979 | Seese . |
| 4,227,145 | 10/1980 | Bonikowski et al. . |
| 4,395,677 | 7/1983 | Petersdorf . |
| 4,406,985 | 9/1983 | Phillips . |
| 4,415,779 | 11/1983 | Bowman . |
| 4,415,850 | 11/1983 | Sherwood . |
| 4,417,202 | 11/1983 | Pascoe .................... 324/509 |
| 4,471,293 | 9/1984 | Schnack . |
| 4,546,309 | 10/1985 | Kang ....................... 324/529 |

FOREIGN PATENT DOCUMENTS

| | | |
|---|---|---|
| 970285 | 9/1958 | Fed. Rep. of Germany . |
| 2509661 | 9/1976 | Fed. Rep. of Germany ...... 324/509 |
| 2809596 | 9/1979 | Fed. Rep. of Germany ...... 324/509 |
| 1272567 | 1/1961 | France . |
| 159650 | 6/1978 | Japan . |
| 0030069 | 2/1984 | Japan ................................. 324/529 |
| 208474 | 11/1984 | Japan . |
| 100985 | 10/1962 | Norway . |

OTHER PUBLICATIONS

"A Combined Voltage and Earth Indicator for D.C. Supplies," G. T. Edwards, Electronic Engineering, Jan. 1965, vol. 37, No. 443, pp. 34–35, Check that Ground, R. Loewe, Allis–Chalmers Tech. Rev., (1948).

Primary Examiner—Reinhard J. Eisenzopf
Assistant Examiner—Jose M. Solis
Attorney, Agent, or Firm—Sheldon & Mak

[57] ABSTRACT

Apparatus for the detection of leakage current in a system includes a power supply and conductors from the supply for supplying power to a load connected to the system. There is an interrupter connected in the system and to a ground point such that a ground leakage current in the system has a closed circuit. Activation of the interrupter about every 12 seconds effectively generates a pulse interrupted ground fault signal. Such signal is detected by a magnetic sensor located relative to a multi-feeder system with high capacitive reactance. The sensor is immune to random electromagnetic and electrostatic conditions in the distribution system. The sensor is synchronized to operate with the interrupter so that sensing is effected at a steady level of a square wave interrupted pulse.

98 Claims, 12 Drawing Sheets

FIG. 2. DETECTOR CIRCUIT BLOCK DIAGRAM (125)

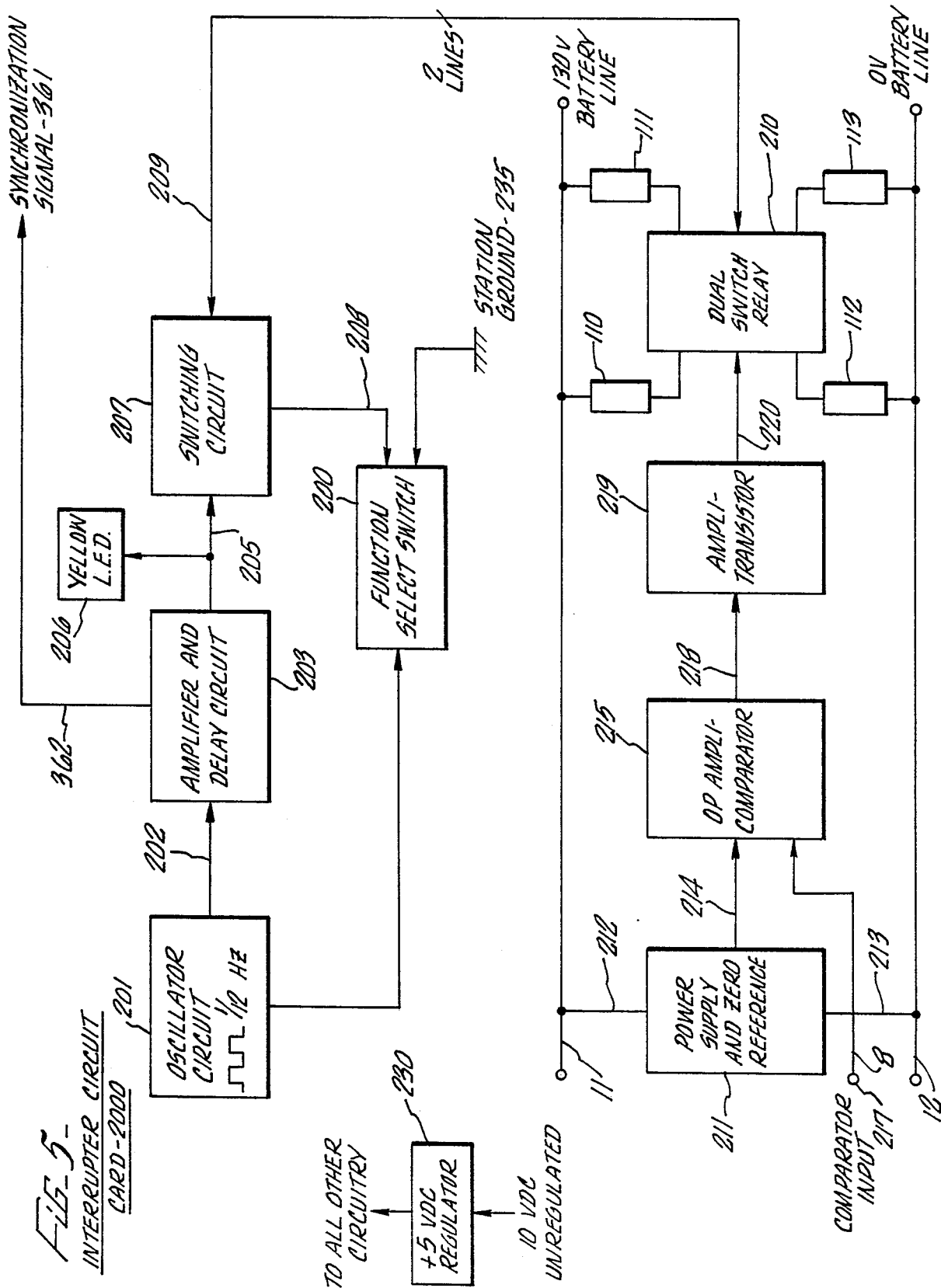

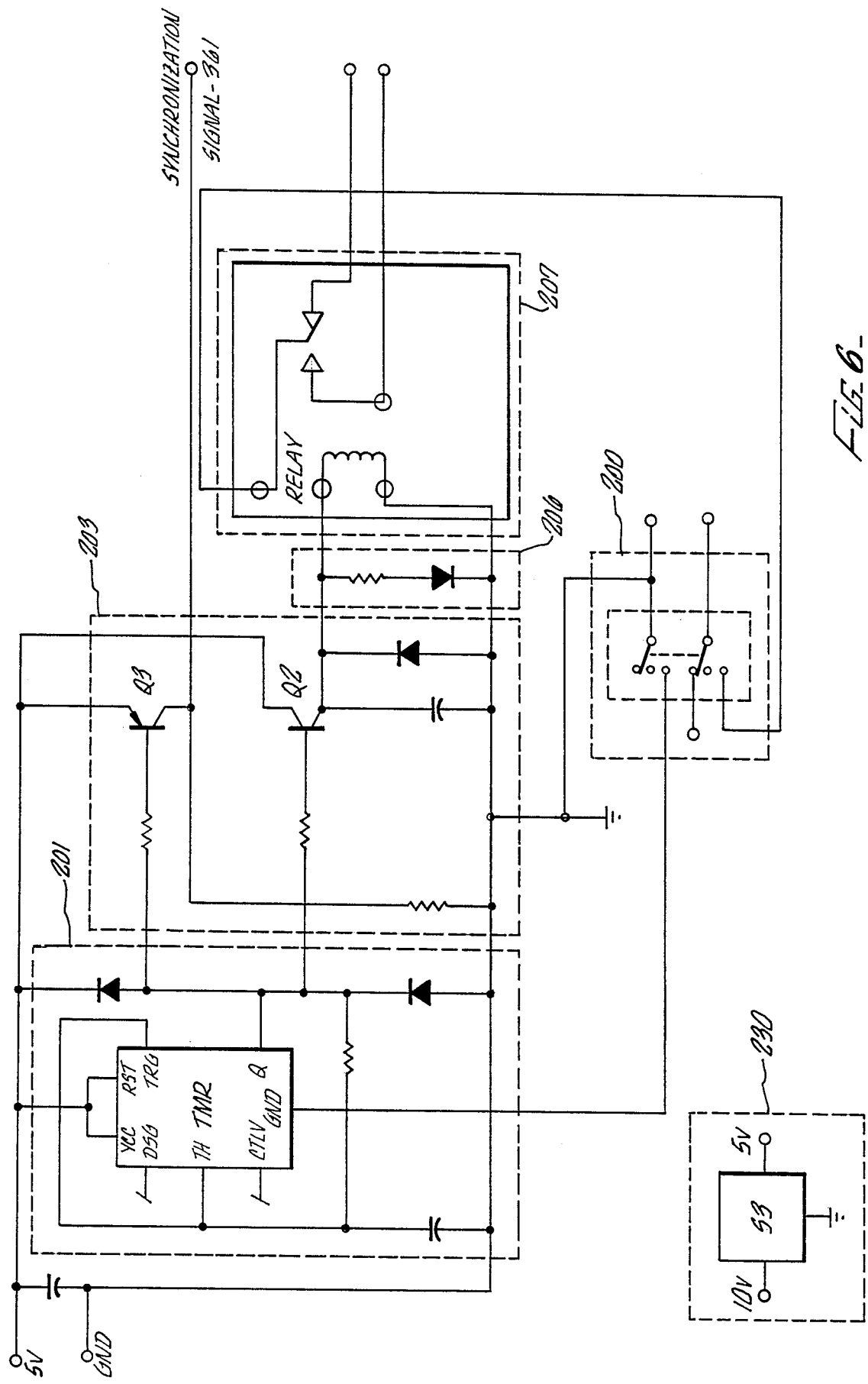

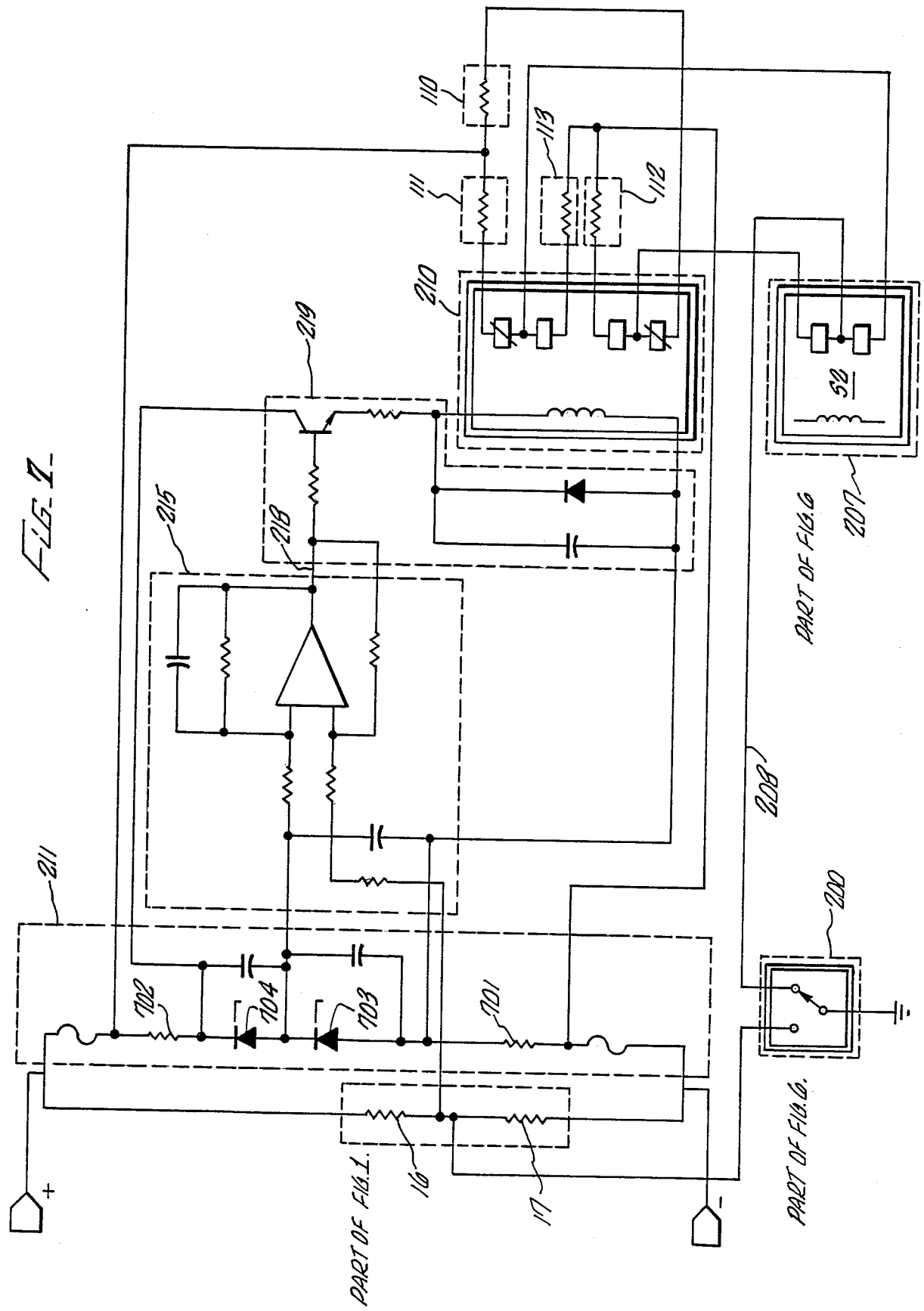

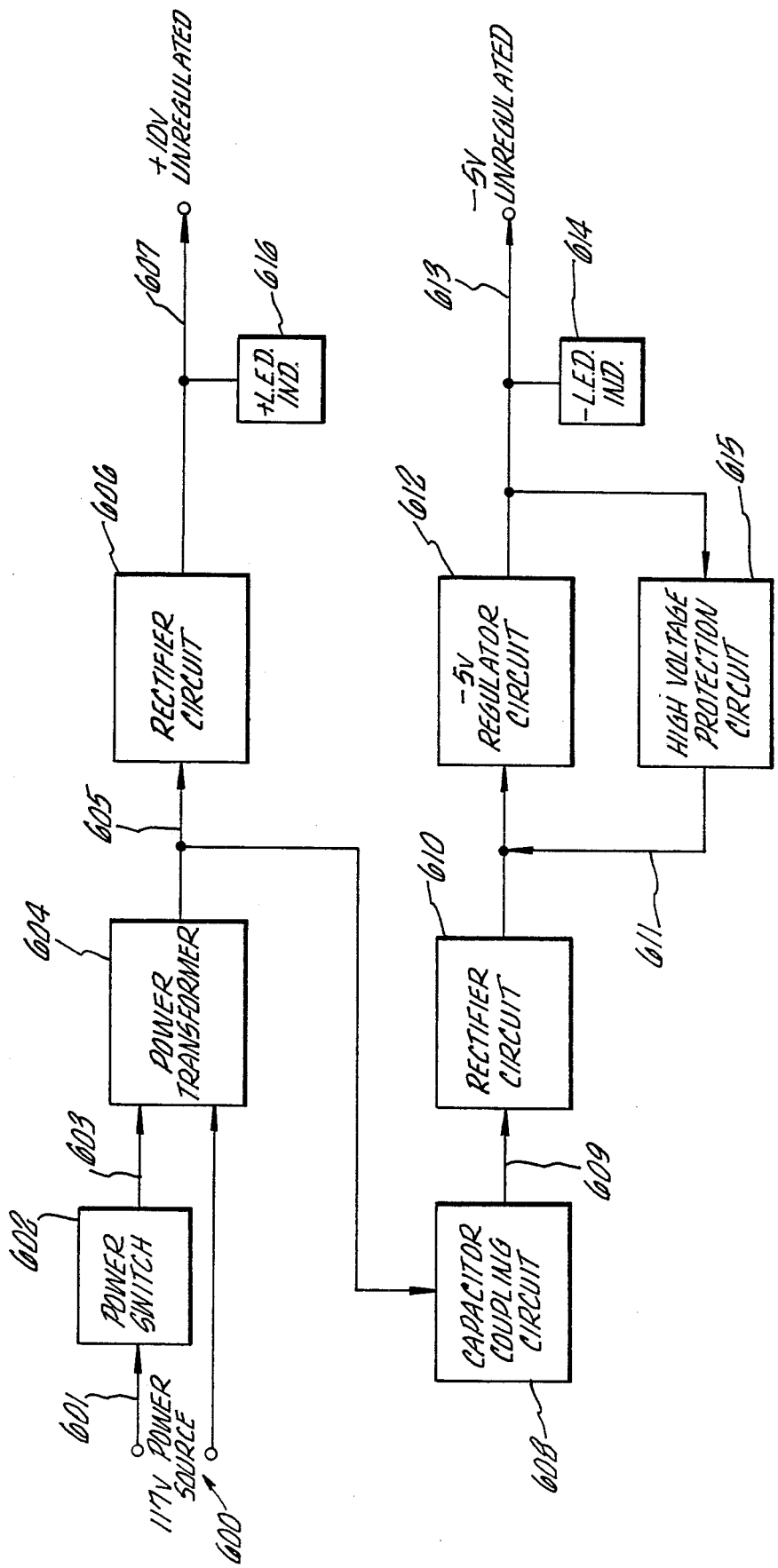
FIG_8_ POWER SUPPLY BLOCK DIAGRAM

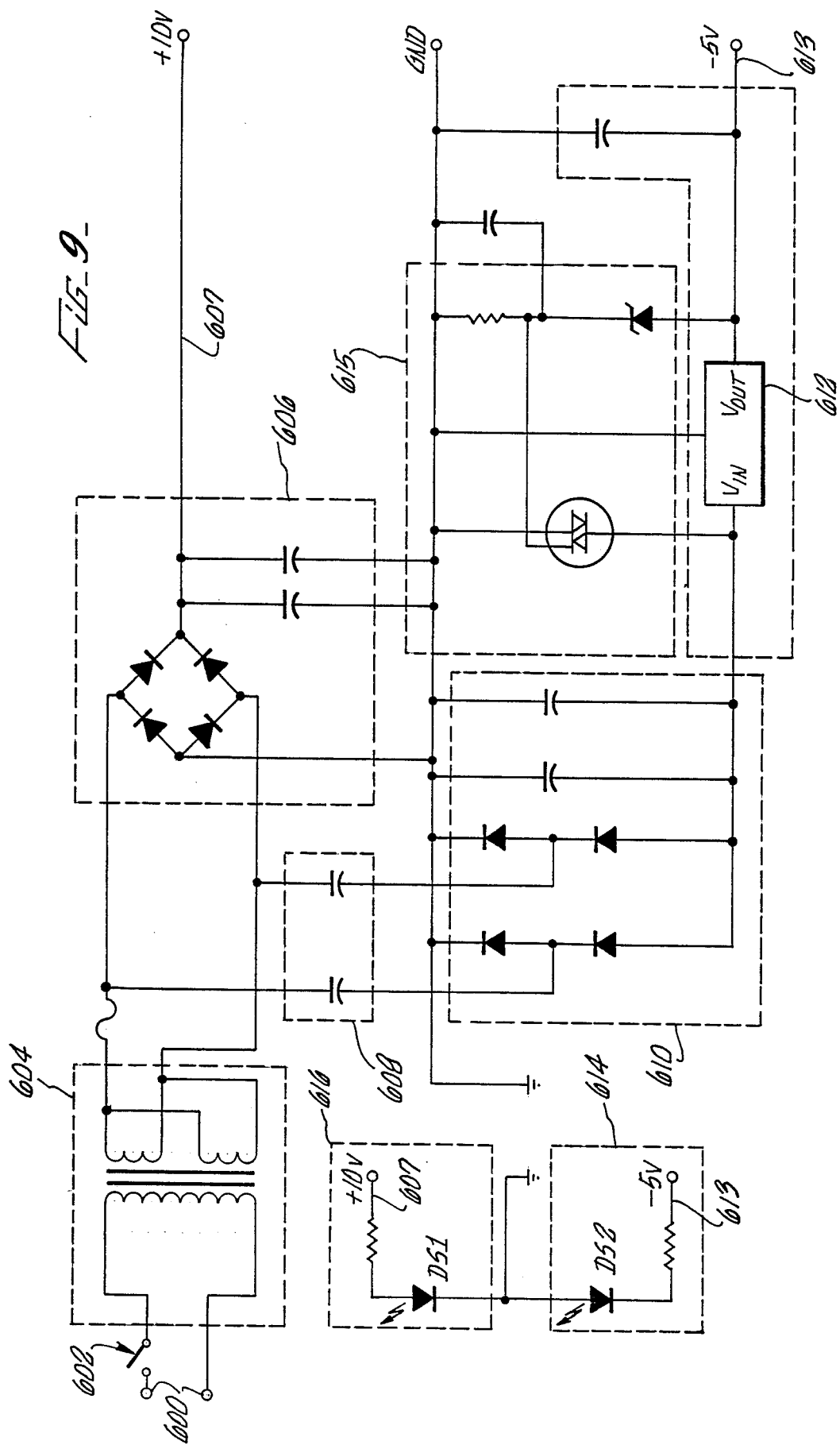

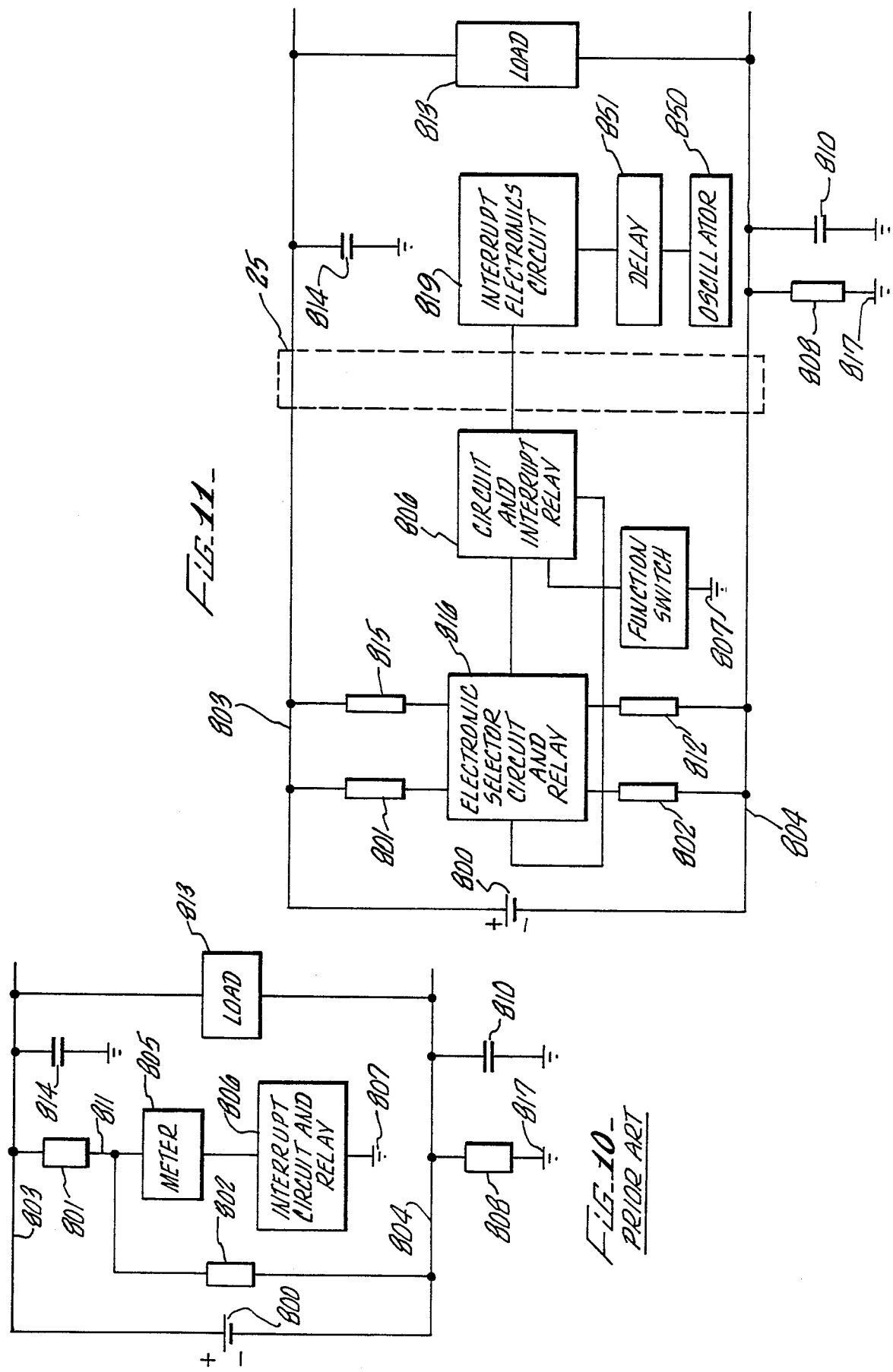

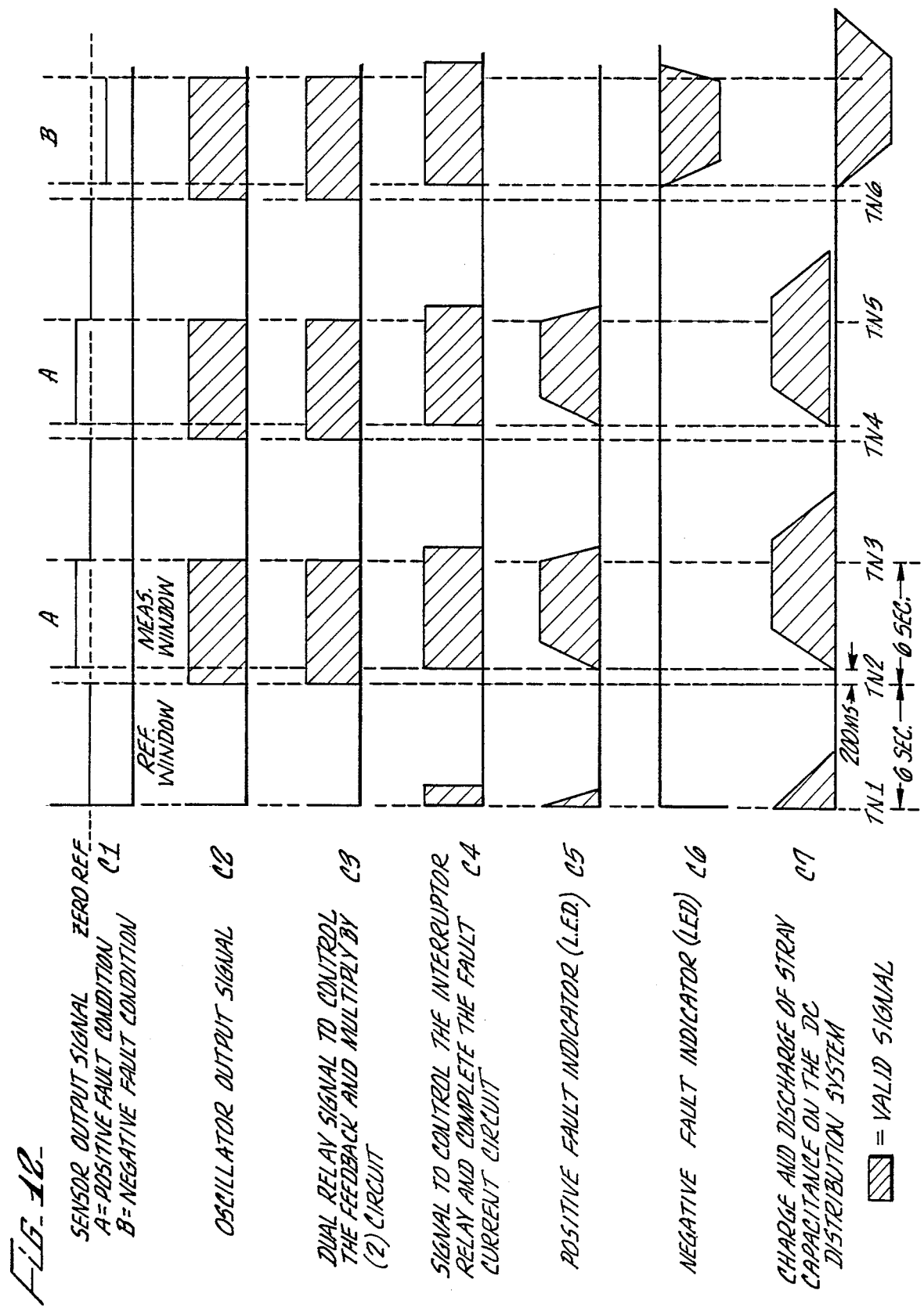

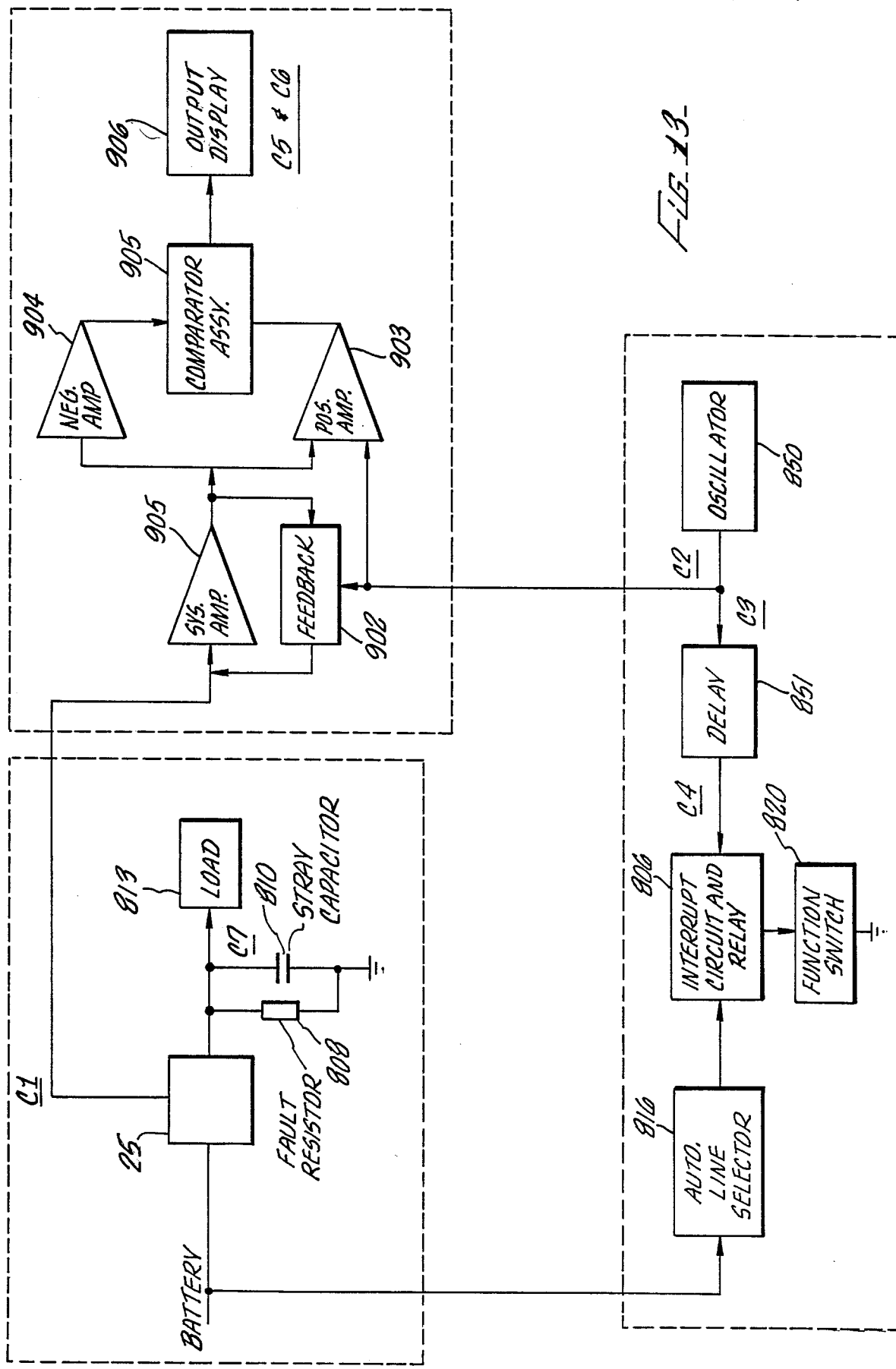

FAULT DETECTION

CROSS-REFERENECE TO RELATED APPLICATIONS

This is a continuation-in-part of applications Ser. Nos. 773,333, filed Sept. 6,1985, now U.S. Pat. No. 4,739,274, and Ser. No. 899,927, filed Aug. 25,1986. Now U.S. Pat. 4,739,27 4. The contents thereof are incorporated by reference herein.

BACKGROUND

This invention relates to fault detection particulary, low level DC fault currents. In particular, it relates to an apparatus and a method for detecting ground faults in normally ungrounded multi-feeder DC distribution systems having significant capacitive reactance components and under the influence of strong electromagnetic fields. These situations are normally associated with utility power generation and distribution, industrial plants, and computer/electronic systems therein. In such systems, ground faults must be located without taking unaffected equipment out of service.

Generating stations and substations use 110 to 240 volt ungrounded battery systems to operate control systems and other DC devices. Some of the control systems are critical to plant operational integrity and must operate at all times. If a ground fault on the ungrounded battery system, if not isolated, will leak battery power to ground. This leakage may be sufficient to affect the battery system's operational integrity by lowering battery voltage. If two ground faults on opposite polarities of the same battery system occur simultaneously in the system, the battery may be shorted through ground. If two or more simultaneous ground faults on the same conductor occur, an undesirable bypassing of controlling devices may occur and cause malfunction or misoperation, consequently isolation and repair of the first fault must, therefore, be performed as quickly and efficiently as possible to minimize the chances that the whole battery system will be shorted or become inoperative.

The major components of an ungrounded DC distribution system usually include the DC battery assembly and battery charger. Main source conductors connect the battery assembly to the circuit breaker of a multifeeder distribution panel, and the individual loads to those feeders. The type of loads associated with this system are motors, solenoids, relays, electronic monitoring equipment, and electronic control devices. A common characteristic associated with this type of system is, firstly, stray capacitance created by the distribution lines respect to ground and, secondly, input capacitive reactance of the loads. The value of the stray capacitance ranges from a few picofarads to 200 microfarads or more. This is an important characteristic since it plays an important part in the type of test equipment that can be used to locate ground fault currents.

A basic problem in such systems is the need to identify low level DC fault currents, namely, low to high impedance ground fault currents in the presence of much larger DC load currents and electromagnetically induced noise currents.

In DC ungrounded power distribution systems, it is important to determine whether a fault resistance exists between ground and any of the distribution lines or loads attached to those lines. Should a fault occur and the resistance value of the fault is below the predetermined alarm value it is important to locate the fault and remove it without interrupting service to the branch or feeder.

One methed used to located ground faults is to open circuit breakers one at a time until the fault disappears. The fault is then isolated during the time the branch circuit is de-energized and repaired. Should a ground fault occur on a critical branch circuit which cannot be opened for ground fault tracing, this method cannot be used.

A known ground detection circuit consists of a center-tapped high resistance connected across the DC source and an indicating voltmeter between the center tap and ground fault antwhere on the Dc system causes an indication of the voltmeter. Since the high resistance limits the ground fault current to a few milliamperes, the faulted equipment will not be tripped off when a low level fault occurs.

Other detection circuits consists of two resistors of equal value connected from each side of the main conductors to ground and a monitor instrument that can be switched between ground and the distribution lines. The monitoring instrument indicates a voltage imbalance when a ground fault exists between line and ground. The imbalance voltage represents a percentage of ground fault to be determined. This circuitry is susceptible to changing loads connected to the distribution lines and the influences of electromagnetically induced noise to identify low level fault currents effectively.

In other arrangements, the resistors are replaced by relays or solenoids driven by parallel windings. Each winding is connected between ground and one of the lines. When a ground fault condition exists an imbalance potential is created on one of the windings which causes current to flow through the windings to activate the electromechanical system and initiate a ground fault condition on the system. The limitation with this type of design is that the instrument is detecting a relatively high level fault current condition only but is unable to determine where the fault is located. Additional troubleshooting is needed to determine the location, and may require the injection of an AC signal into the DC system in order to trace the source of the fault. This method cannot be used on systems having large stray capacitance or sensitive electronic equipment as loads since the AC injected signal has to overcome very low impedance paths to ground. The lower the impedance the larger the AC injected signal needs to be to locate the fault. With high energy levels it is possible inadvertently to trip control devices or damage electronic equipment or loads connected to the system. The critical nature of these circuits requires them not to be turned off to locate the fault. Thus, a fault detection system is needed to locate the faulty equipment without interrupting these critical circuits.

It is also known elsewhere to test for DC faults in small systems employing grounded 12-volt battery type power supplies in automobiles and the like. Such grounded DC systems require the connection of an injector across terminals of the battery supply. Thereafter, a detector is applied over the wiring system with sound detection means so that an increasing sound would indicate where a DC fault exists. The limitations of this type of design has been identified above. Such systems operate in response to high DC fault currents in an environment where there is no significant capacitive or inductive reactances of consequence and where the DC system is effectively shut off when the fault detection is being made.

It is also known in AC systems to detect ground leakage by a relay which interrups the system so as to introduce a fault current in the sense of a pulsating input. Such systems, however, are of a nature that a D'Arsonval type meter of permanent magnet moving coil meter are used for detection of the pulsating input. Such a meter requires a current transformer suitable for detecting relatively large AC fault currents. This is unsuitable for measuring pulsating DC fault currents of a lower value. These detection systems are particularly unsuitable in high electrostatic and electromagnetic environments.

In another method of ground fault detection, a slope detector is used to detect an interrupt signal having a frequency of 2Hz per second. This signal is obtained by connecting two 5,000 ohm resistors from each side of the DC distribution line through an interrupter relay to ground. By controlling the opening and closing of the relay, the fault current is interrupted to generate a DC fault pulse. At the same time, a magnetic sensor and associated electronics is used to detect the rise and fall, namely, slope, of the interrupted DC signal. When a positive identification of the fault current is achieved, a periodic audio signal is generated or a flashing LED display is activated. With this detection method should the stray capacitance of the DC distribution system be above about 50 microfarads and the fault reisistance is above 5,000 ohm, the identification of the fault location may be difficult since the stray capacitance on the line can absorb most of the initial current generated by the interrupt pulse. This can cause a false slope signal to be produced and the detector circuit will acknowledge this as a fault condition. Also external electromagnetic interferences can produce an unwanted output signal that can interfere with the detector.

There is thus a need to overcome disadvantages of the prior system, and provide an effective means for detecting and locating faults in a supply system.

SUMMARY OF THE INVENTION

The disadvantages of prior systems are overcome with a detection system using synchronization and a detection circuit operating at low energy level values, and means for eliminating the effects of stray capacitance and unwanted electromagnetic interferences.

According to the invention, there is provided apparatus and a method for the detection of fault signals in a supply system including conductors for supplying power to a load connected in the system. There is an impedance element for connection across the power supply, a tapping point to the impedance element and a connector between the tapping point and a point to ground to complete a circuit for a fault signal in the system. An interrupter periodically pulses a ground fault signal into the system thereby to generate a pulse interrupted signal, and a magnetic detector relative to the system senses the interrupted signal and thereby provides for detecting the location of the fault. The detector is adapted to operate in synchronization with the interrupter whereby the detector senses a substantial steady state pulse level.

In the preferred form of the invention, the pulse is a square wave and the detection is effected during the steady state high level of the square wave. The interrupter circuit consists of a resistor/capacitor oscillator circuit which generates a synchronization signal or alternatively a crystal oscillator can be used to generate the synchronization signal.

The detector assembly can determine whether a positive or negative conductor of the multifeeder system has the fault.

The stray capacitance in the system is substantially discharged prior to detection of a fault, through a bank of resistors, partly included in the impedance element, and the cycle for the square wave is determined such that there is sufficient time for discharging the stray capacitance. A pulser or interrupter is adapted to interrupt the ground fault circuit periodically to generate an interrupted ground fault signal.

There is provided an apparatus and method for the detection of low level ground leakage currents in a normally unground multi-feeder DC distribution system which includes a DC power supply and multiple conductors from the supply for supplying power to load means connected to the multi-feeder DC distribution system.

The ground fault signal is detected by either a permanently located and/or portable sensor means located relative to the DC system such that a steady level interrupted DC ground fault signal can be detected by the sensor means. A low level ground fault can thereby be located in a DC system.

The sensor means includes means for suppressing noise, and also includes means for eliminating the effects of distribution system capacitive and inductive reactance, stray capacitance and changing magnetic field effects of undesired electromagnetic and electrostatic sources.

THEORY OF OPERATION

When the electrical current flows through a conductor it generates a magnetic field in the space surrounding the conductor. The direction and strenght of this magnetic field is dependent on the intensity and direction of the electric current flowing through the conductor and the distance from the center of the conductor. With a toroidal ring of ferromagnetic material placed around the conductor, part of this magnetic field will be confined inside this ring. By cutting a gap through the toroidal ring and placing a magnetic sensitive component inside of this gap this device functions as a probe to detect and provide information defining the direction and intensity of the electric current that flows through the conductor.

When the magnetic saturation point is reached large changes in current flow in the conductor produce small changes to the magnetic field in the toroidal ring surrounding the conductor. One manner of overcoming a saturation condition is to pass through the magnetic ring an additional conductor (the return path conductor) having a normal operating current flow of the same magnitude but opposite direction. Consequently the net magnetic field inside the magnetic toroidal ring will equal zero. Other external sources of magnetic field such as metal structures have been found to change the zero magnetic balance and produce influencing magnetic fields that the detectable by the magnetic probe. To overcome the final magnetic field summation the value is made to equal zero. Any imbalance of current flow in any one of the two conductors being monitored generates a change in magnetic field. This change detected by the magnetic probe provides information about the magnitude of the differential current flowing in the conductors.

DRAWINGS

FIG. 5 is a block diagram of the interrupter means for detecting interrupted ground fault signals.

FIG. 6 and FIG. 7 are detailed schematic circuits of the interrupter means.

FIG. 8 is a block diagram of the power supply.

FIG. 9 is a detailed schematic circuit of the power supply.

FIG. 10 and FIG. 11 are general schematics illustrating certain principles of the invention, FIG. 10 being a prior art arrangment.

FIG. 12 is a timing cycle of an interrupter pulse showing the detection timing.

FIG. 13 is a block diagram illustrating the electronic system of the detector.

DESCRIPTION

The invention is described in detail with reference to an unground DC system for detection of ground faults.

Figure 1:
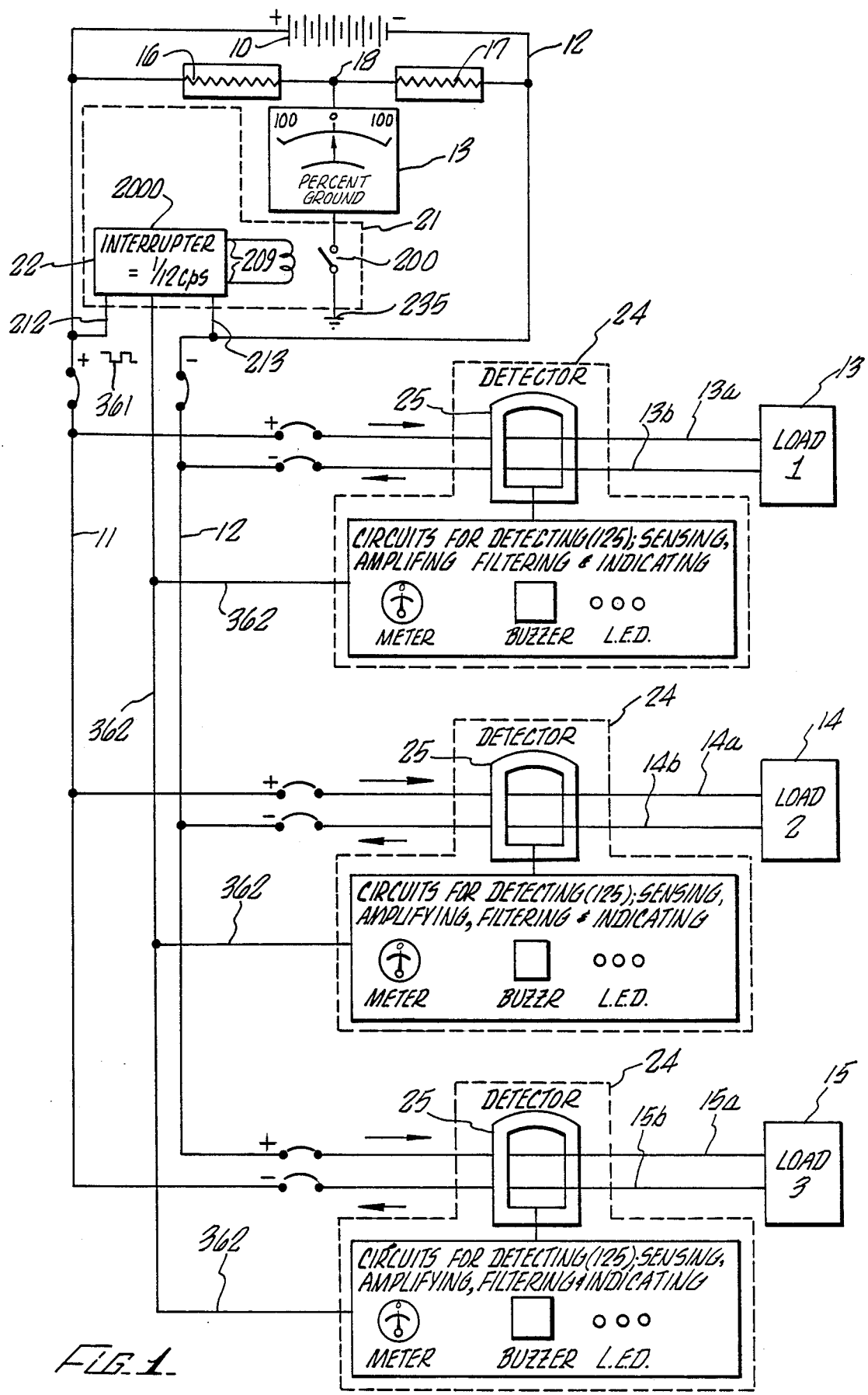
FIG. 1 is a block diagram illustrating an ungrounded DC system with various loads, and in which a ground fault is present in one of the loads, including detector means for sensing such fault by means of sensing interrupted pulses.

In FIG. 1, apparatus for the detection of low level ground leakage in a normally unground DC system comprises a DC power battery supply 10. Main bus bars 11 and 12 from the battery supply 10 supply power to different loads 13, 14 and 15 in this exemplary embodiment. Conductors 13a and 13b from main bus bars 11 and 12 connect with load 13. Similarly, the main bus bars 11 and 12 are connected to load 14 through conductors 14a and 14b. There are conductors 15a and 15to load 15.

Across the bus bars or conductors 11 and 12 are resistor banks 16 and 17 and between these resistor banks 16 and 17 is a tapping point 18. A responsive element in the form of a ground indicator meter 19 is connected between the tapping point 18 and function switch 200 and through function switch 200 to a ground point 235 such that a ground fault leakage in the system closes a ground circuit to activate the indicator meter 19. Function switch 200, in one position closes the existing alarm system to ground and in a second position activates the ground fault detector system. An interrupter circuit 2000 has an input reference signal connected to point 18 through line 216. Lines 212 and 213 connect the interrupter circuit 2000 to lines 11 and 12. On line 362 there exists a synchronization signal 361 to a detector circuit 125. Line 209 connects the interruptor circuit 2000 to the function switch 200 and through the function switch 200 to ground point 235. In the interrupter circuit 2000 there is a relay that opens and closes at a frequency of at least 1/12 Hz. In this fashion a steady but interrupted DC fault current is generated through the ground fault circuit and thereby the DC ground fault signal is obtained.

In the one example of the invention, for each load circuit 13, 14 and 15, there is provided a detector sensor 24 respectively. Such detector or sensor 24 includes a magnetic sensing element 25. A detection circuit 125 to indicate whether an interrupted ground signal sensed by the magnetic sensing element, which, for example, is a Hall Effect detector sensing element 25 is related to conductor lines 13a, 13b, 14a, 14b, 15a or 15b, respectively. Line 362 provides a synchronized signal 361 from the interrupter circuit 2000 to detector circuit 125 in detector 24 to ensure timing operation between pulses from the interrupter 2000 and the operation of the detector circuit 125 in detector 24. This greatly enhances sensitivity and performance as is more fully described below.

The interrupter 2000 need not be placed into operation until such time as the ground fault indicator 19 detects the existence of a ground fault current in the embodiment described. In some cases, however, the indicator 19 is dispensed with, and the interrupter 2000 is continually applied irrespective of the indicator 19. With such arrangement, any portable or permanently located detected 25 and/or sensor 24 can indicate a fault current.

Reference is made to FIG. 10, FIG. 11, FIG. 12 and FIG. 13, which outline some of the general principles of operation of low level ground fault leakage detection. FIG. 10 is a depiction of prior art probles addressed by the invention as depicted in FIGS. 11, 12, and 13.

In FIG. 10, an ungrounded DC distribution system of, for instance, 130 volt battery supply 800, includes two limiting resistors 801 and 802 of 5000 Ohm connected from each line 803 and 804 to a meter 805. The meter is connected to an interrupt relay 806 and in turn to station ground 807. When a fault resistance exists at any location on the system, an imbalance voltage between the lines 803 and 804 and station ground 807 is produced. This imbalance is proportional to the fault resistance 808 and is indicated by the instrument 805 monitoring the system. If a direct short circuit from one of the lines 803 and 804 to ground exists. this causes electrical current to flow from the line without the short to the limiting resistor connected to that line. In FIG. 10, this is line 803 and resistor 801. From this resistor 801, current flows to the meter 805, from the meter to the interrupt relay 806, from the interrupt relay 806 to station ground 807, through to a point 817 where the fault is located and from the fault point through the fault resistor 808 to the line 804 with the fault, and back to the DC distribution system.

For a short circuit condition the value of the leakage current is about 26 milliamperes. In this condition, stray capacitance 810 associated with the line 804 having the short circuit is dissipated and the interrupt current has an instant value of 0 and 26 milliamperes.

For a distribution system with a stray capacitance of 100 microfarads or more and a fault resistance of 40,000 Ohm or more, the system response is different. When the interrupt relay 806 closes the current from the center tap 811 of the two resistors 801 and 802 is divided in three directions. The higher current path is through the 5,000 Ohm reisitor 802 attached to the fault line 804. The current value for a 5,000 Ohm resistance 802 is 12.2 milliampers. The second current path is through the 40,000 ohm fault resistor 808 and the value at the first interruption cycle of 806 is 1.5 milliamperes. The third path is the current flow into the stray capacitance 810 of the line and this accumulates as electrical energy.

When the interrupt relay 806 closes, it takes approximately 0.5 seconds for the interrupter circuit to reach steady state. The steady state voltage between lines 804 with a ground fault and ground is 61.0 volts DC. When the interrupter relay opens, it disconnects meter 805 and the two 5,000 ohm resistors 801 and 802 from the ground 807. The electrical energy accumulated on the stray capacitance 810 of the line discharges through the fault reisitance 808 as an exponential decay.

The time constant of the electrical circuit formed between the stray line capacitance of capacitor 810 and the leakage fault resistor value of resistor 808 is the product of Rf and Cs. For this particular case the time constant is 4 seconds. Consequently the voltage across the fault resistor 808 and the stray line capacitance 810, 4 seconds after the interrupter relay opens circuit opened, is 28.18 volts which is 38% of the initial steady state voltage of 61.0 volts DC. The voltage value across the fault resistor 808 and stray line capacitance 810, 1 second after the interrupter circuit opened is approximate 50 volts (25% of the time constant). If the interrupter circuit operates at a frequency of 1 cycle per second the differential current through the fault resistance 808 is 0.25 milliamperes. The reason for only 0.25 milliamperes is that it is after the second interruption and thereafter will only produce 11 volts of differential voltage across the fault resistor 808. This leakage current of 0.25 milliampers is considered very small to produce a strong and steady ground fault signal.

In order to overcome the problem of detecting very small current values and abtain a higher value of leakage current, through fault resistor 808, improvements have been incorporated in the interrupter circuit 806 that produces the ground fault interrupt signal.

One of such improvement, as illustrated on FIG. 11, is that through electronic switching only the limiting resistor 801 attached to the line without the fault is connected to the interrupter relay, the other resistor 802 is removed from the interrupter relay. In this fashion when the interrupter relay closes, the ground fault current will flow through the limiting resistor 801 to ground 807 and from ground 817 through the fault resistor 808 and back to the DC distribution system. At about 0.5 second after the interrupter relay closes a steady state is reached and the current flowing through the fault resistor 808 is approximated 2.88 milliamperes. When interrupt relay 806 opens the voltage across the stray capacitance 810 is approximately 110 volts. In order to discharge the stray capacitance rapidly, a discharge resistor 812 is switched from the line with the fault to ground. Should the value of this resistor 812 be equal to the current limiting resistor 801, the time constant to charge the circuit is equal to the time constant to discharge the circuit.

An additional improvement involves the extension of the interrupt relay cycle, which is illustrated in FIG. 12. By extending the cycle to a 12 second period, namely, 6 seconds for the fault current to flow and 6 seconds for the stray capacitance to discharge, the leakage current available as a pulse is approximately 2 to 2.75 milliampers. This value is about 10 times higher as compared with one or two interruptions per second and no discharge resistor.

The circuit of FIG. 11 illustrates the system connected to loads 813. Also, the stray capacitance 814 is illustrated in the line 803 without the fault. Limiting resistors 801 and 802 and discahrge resistors 812 and 815 are shown. The various resistor connections with the lines 803 and 804 are made through a selector relay 816.

The system is also designed to distinguish in which line, position or negative, of the system the fault exists. Electronically, the detector can determine this, with the magnetic sensor located about both conductors.

The timing diagrm of FIG. 12 indicates the period of 12 seconds for the interrupter pulse. The detector is designed electronically to be sychronized to measure and sample the pulse during the flat high current level of the interrupt pulse. Thus, with this timing the sensing is effected with a flat DC level and, hence, noise effects are eliminated. By the timing arrangement to effect sensing, spurious electromagnetic effects and changes are balanced and nulled from the system. Extremely small DC signal variations in the DC system can thus be sensed. This is isnce the DC interupter pulses and the system is overall far more sensitive than prior art systems.

FIG. 11 illustrates the ground fault detector set-up on one brance of a DC distribution system. An automatic selector circuit 816 detects any imbalance on the DC distribution system and chooses a pair of resistors 801 and 812, or 802 and 815, one from the positive line and more from the negative line, to be alternatively connected to the input of the interrupter relay 806 abd from the interrupter relay to the function switch 820 and from the function switch to ground 807 Also, illustrated in FIG. 11 is the magnetic sensor 25 the oscillator 850, the delay circuit 851, and a fault resistance 808 along with the stray capacitance 810, 814 (Cs) associated with the positive and negative lines.

When the ascillator circuit 850 changes from low to high (C2 on FIG. 12) the signal is passed to the delay circuit 851 and after 200 milliseconds (C4 on FIG. 12) the signal is applied to the interrupter relay 806 to control the closing operation. When the interrupter relay 806 is activated, 801 abd 812 are already connected to the inputs of the interrupter relay. Resistor 801 is first connected to ground through the selector 816 and interrupter relays 806 through the function switch 802. This condition creates a leakage current through the leakage resistor 808. The magnetic field on the sensor 25 (C5 of FIG. 3) is sensed and fed to the electronic circuit for processing.

When the oscillator circuit 850 goes low, the interrupter relay 806 opens and resistor 801 is disconnected and resistor 812 is connected to ground biasing the automatic interrupter relay 806 through the function switch 820. This set-up discharges the stray capacitance 810 of the line with a time constant of less of 4 seconds.

FIG. 12 shows the charge and discharge of the stray capacitance of the line as the C7 wave-form representation The full line of wave-form C7 represents the voltage across the stray capacitance of the line when resistor 812 is used. The need for this arises from the comparative instrument that compares the reference voltage value before the interrupter relay closes to the voltage value when the interrupt relay was open. If the stray capacitance of the line is not fully discharged the differential voltage between the two stages is less, and the output of the sensor 25 is partially utilized.

Figure 2:
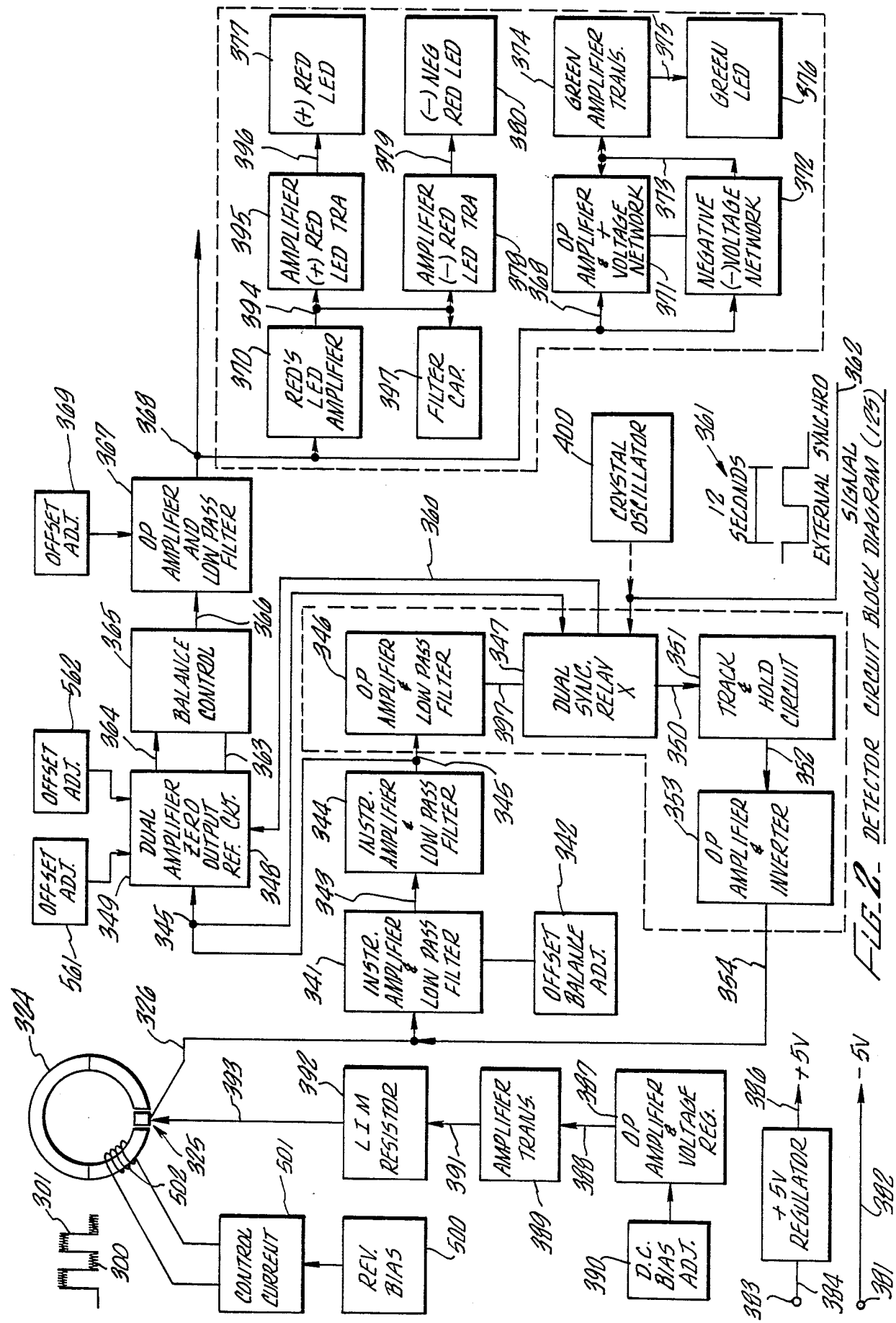
FIG. 2 is a detector circuit block diagram.

The method is used to a read small changes of DC current (ranging between 2 to 20 milliamperes) on conductors transporting large DC currents (ranging between 1 to 20 Amperes) using magnetic sensor 25. The magnetic sensor 25 illustrated in FIG. 2 is composed of a magnetic ring 324 with a gap with a magnetically sensitive component 325 placed inside this gap. The toroidal ring with sensor component 325 is placed around the two conductors, illustrated in FIG. 1, 803, 804 furnishing power to the loads 813 connected to the conductors. With this arrangement the magnetic field produced by the load current is equal to zero, since the current flow in each conductor is equal but flows in opposite direction. All other external magnetic field sources produce outputs of the magnetic sensor 25 and the cumulative sources value is used by the system as a zero reference level.

The electronic circuitry required to perform the above task is illustrated of FIG. 13. The signal generated by the magnetic sensor probe 325 is passed through a system amplifier circuit 901. Associated with this system amplifier circuit 901 is a negative feedback loop 902 which controls the overall gain of the system amplifier 901. The opening and closing of the feedback loop is controlled by a signal generated in an oscillator circuit 850 (C2 signal in FIG. 12).

The output of the system amplifier circuit 901 is fed to a positive amplifier 903 "multipy by +2" and to a negative amplifier 904 "multipy by −2" circuit simultaneously. The output of those two circuits 903, 904 has its input controlled by the C2 signal (FIG. 12).

The combined operation of the oscillator circuit 850, the system amplifier 901, the feedback loop 902, and the "multipy by +2" and "multipy by −2" circuit 903, 904 operate as follows with reference to FIG. 12 and FIG. 13. When the C2 signal that is generated on the oscillator circuit 850 is low the feedback loop 902 is closed and the overall gain the system gain of the system amplifier is about 200. At this time the combined output of the two "multiply" circuit 903, 904 is equal to zero. In the next event, when C2 signal goes high and is applied simultaneously to the feedback loop circuit 902 and to the "multiply by +2" circuit 903, the following signal changes are taking place. The negative feedback loop opens its input and it will retain at its output the DC control siganl that is applied to the input of the system amplifier circuit 901. The "multiply by +2" circuit 903 opens its input and will retain at its output the last signal value applied to the comparative resistor network 905. If at this time a magnetic field change is introduced, C1 of FIG. 12, into the magnetic sensor assembly 325, its output will change and this change is passed to the system amplifier circuit 901 without any negative feedback being present at this time. Consequently, the system amplifier circuit 901 gain is increased by approximately 100 making the total gain of this circuit approximately 20,000 (200×100). The output siganl from the system amplifier circuit 901 is fed only to the input of the "multiply by −2" circuit 904 whose output is fed into the comparative resistor network 905.

At the comparative resistor network 905 the signal from the "multiply by −2" circuit 904 is summed with the fixed value signal produced at the output of the "multipy by +2" circuit 903 and the resulting algebraic summation feeds into the next amplifier stage which controls the displaying LED 906. In order to avoid a race condition between the simultaneous opening of the feedback loop 902 and the "multiply by +2"circuit 903, with respect to the new added value of DC fault current on one of the two conductors passing through the magnetic sensor assembly 325, a delay of 200 milliseconds is added to the interrupt signal. This timing delay controls operation of the interrupter relay 806. This in turn controls the release of DC fault current that is used to create the magnetic field variations.

In the block diagram of FIG. 2, which is the detector circuit 125, sensor 324 is a magnetic sensor element, essentially a ring core, for detecting interrupted DC ground fault magnetically coupled signals A magnetic current sensing element 325, such as a Hall Effect or similar sensor element, receives a composite interrupt signal 300 with superimposed noise 301. These siganl and noise are fed from the magnetic sensing element 325 along conductor 326 and this provides balanced signal characteristics.

The balanced composite signal is fed to a DC precision instrument amplifier and low pass filter 341, which transforms the differential input balanced signal to a balanced output signal. Offset balance control 342 conditions the output of device 341. The output signal of 341 is fed along conductor 343 to a second instrument amplifier and low pass filter 344 which transforms the balanced input signal into an unbalanced output signal. The output signal of 344 is fed along conductor 345 to an operational amplifier and low pass filter 346. The output of operational amplifier and low pass filter 346 is fed into 397 and into one side of switch relay 347. The input of switch relay 347 is controlled via line 362 which carries a synchronization signal 361 from interrupter circuit 203 (FIG. 5). The output signal of relay switch 347 fed alond conductor 350 to a track and hold circuit 351. The output signal of the track and hold circuit 351 is fed along conductor 352 to an operational amplifier and inverter circuit 353. The output signal of circuit 353 is fed along conductor 354 to the input of the instrument amplifier 341.

The output signal from the instrument amplifier 344 is also fed along conductor 345 to an operational amplifier 349 and to one side of the dual switch relay 347. The output signal from half of switch relay 347 is fed into line 360 and to the input of an operational amplifier 348. Operational amplifiers 348 and 349 have offset adjust element 561 and 562. The output signal of the operational amplifier 348 is fed into line 363 and to one side of a balance control 365. The output signal of the operational amplifier 349 is fed into line 364 and to one side of the balance control 365. The center tap of balance control 365 is fed into line 366 and to the input of operational amplifier and low pass filter 367. Operational amplifier 367 has a DC offset control adjustment 369.

The output signal from the operational amplifier 367 is fed into lines 368 to the input of an operational amplifier 370, to the input of an operational amplifier 371 and to the input of a network circuit 372. The output of operational amplifier 370 is fed into lines 394 and into an amplifier circuit 395. The output of the amplifier circuit 395 is fed into line 396 and into a positive fault indicator red Light Emitting Diode (LED) 377.

Line 394 also feeds the circuit element filter capacitor 397 and into amplifier circuit 378. The output from amplifier circuit 378 is fed into line 379 and into a negative fault indicator red LED 380.

Line 368 also feeds into the negative voltage eliminator circuit 372. The output of circuit 372 feeds into line 373 and also into an amplifier circuit 374. The output if the amplifier circuit 374 feeds into line 375 and into zero fault indicator green LED 376. Line 368 feeds into operational amplifier and positive voltage network 371. The output of 371 feeds into line 373 and into the green amplifier transistor 374.

This circuit receives the minus 5 volts from the power supply and regulator at point 381 and fed into all operational and amplifiers from line 382. Also, a 10 volt unregulated power supply is connected to point 383, the ouput from 383 is fed into 384 and into the input of a 5 volt positive voltage regulator 385; the output voltage regulator 385 is fed into line 386 and to the electronics of the circuit.

Operational amplifier and voltage regulator 387 outputs a control signal into line 388 and into amplifier circuit 389 and device 387 has a DC bias adjust control element 390. The output of amplifier circuit 389 is fed into line 391 and into a current limiting component 392 and into line 393. Line 393 provides a constant voltage source to the magnetic current sensing element 325.

The DC instrument amplifier and low pass filter 341 receives the signal transmitted along conductor 326 from the magnetic current element 325 and passes only those signals that are 30 Hz or less. For proper operation, the differential output voltage range of the DC amplifier 341 is within "2 millivolts.

In order to ensure that the output voltage of the DC amplifier 341 is in the appropriate range, a balance adjustment element 342 is provided. The differential output signal of circuit 341 is fed into instrument amplifier 344 and transformed into an unbalanced signal. The output signal from circuit 344 is split into two paths. One path is to source the automatic gain control (AGC) loop circuit. The components in this circuit are the relay 347, and circuits 346 and 353. The other path sources the display signal circuit which consists of relay 347, circuits 348, 349, balance element 365, operational amplifier circuit 370, 371, 374, 378 and display LEDs 376, 377 and 380.

Upon the initialing condition, the synchronization siganl 361 that feeds into line 362 is low, and dual relay 347 is maintained closed.

The automatic gain control loop provides a negative feedback loop and the overall gain of instrument amplifier 341, 344 and oprational amplifier 346 is approximate 200. The automatic offset adjustment element 342 sets the signal at line 343 to a differential value of zero volts. Consequently there is a DC signal of zero volts on line 345. This signal on line 345 has a steady range of ±3 volts. The interpretation of this capture range is that after the offset adjustment element 342 renders line 343 equal to a differential value of zero volt, later in time, external magnetic sources can change this differential zero volt signal on line 343 to values that in turn will modify line 345, due to amplifier circuit 344, to values of ± volts. The signal on line 345 simultaneously feeds operational amplifier 348 and 349, within a range of ±3 volts. Thus the outpt of circuits 348 and 349, will be compared through balance control 365 and the balanced output is fed on line 366 and will have a value of zero volts, for any value of the signal on line 345 between ±3 volts. This zero output signal is fed into the input of amplifier 367. The output signal of amplifier 367 is adjusted to zero volts by a bias offset element 369.

The output signal from 367 is passed to circuits 370, 371 and 372. With this signal equal to zero volts, circuit 370 will be turned off and the positive and negative fault indicator red LED will be turned off and the green LED is turned on indicating no fault current When the synchronization signal on line 362 goes high, the dual relay 347 opens the automatic gain control (AGC) loop and the negative feedback circuit is out of the circuit. The DC value of line 354 will remain constant due to the track and hold circuit 351 which maintains the last value transferred at its output before interruption of relay 347. With the absence of the negative feedback, the overall gain of the amplification of amplifiers 341 and 344 circuit will be increased by a factor of a thousand. The second half of the relay 347 will open the line between the positive input of operational amplifier 348 and instrument amplifier 344. The operational amplifier 348 acts as a track and hold circuit and its output will not change as long as switch relay 347 is open. A capacitor 548 in operation amplifier 348 holds the output on line 363 fixed when switch 347 is opened.

200 milliseconds after the synchronization signal 361 goes high, switch relay 207 (FIG. 5) of the interrupter card closes. This allows the DC ground fault current to flow and be detected by the magnetic sensor. Should sensor 324 detect a change of its magnetic field, this change causes a change in the output voltage to the input of amplifier 341. This input voltage change is amplifier with device 341 and fed into device 344. After amplification and filtering provided by 344, and since relay 347 is open, amplifier 349 is the only device which receives the signal from line 345. With the output of amplifier 348 constant and the output of 349 variable, the balance control 365 output changes proportional to the variation of the input signal. This change is amplified by 367. Should the signal on line 368 be above 250 mV, the positive fault indicator turns on, and the no fault indicator green LED goes off. Should the signal on lines 368 be low —250 mV, the negative fault indicator turns on and the no fault indicator green LED goes off.

When a portable detector unit is used, a local crystal oscillator 400 as illustrated on FIG. 2, is used to synchronize with the crystal oscillator of the interrupter card as a real time clock. Control current device 501 provides a manual or electronic control DC offset current through the magnetic sensor via lines 502. The purpose of this arrangement is to place the portable unit arround one conductor, for instance, conductor 13a only (FIG. 1.). Reverse offset adjustment 500 counteracts the magnetic field caused by the normal circuit current and allows the magnetic field caused by the fault current only to be detected by the magnetic sensor 325.

Figure 3:
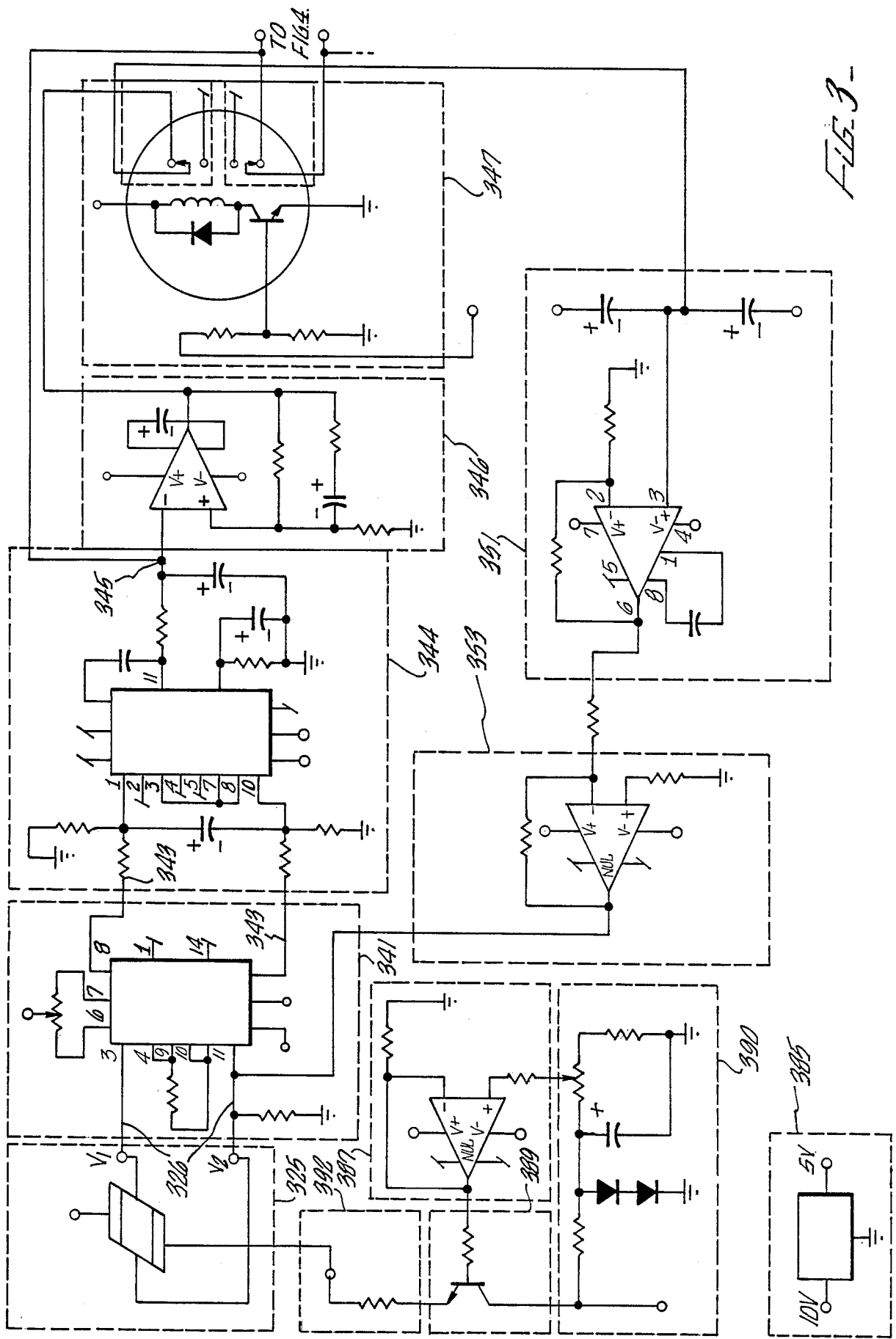
FIG. 3 and FIG. 4 are detailed circuits of the detector circuit block diagram of FIG. 2.
Figure 4:
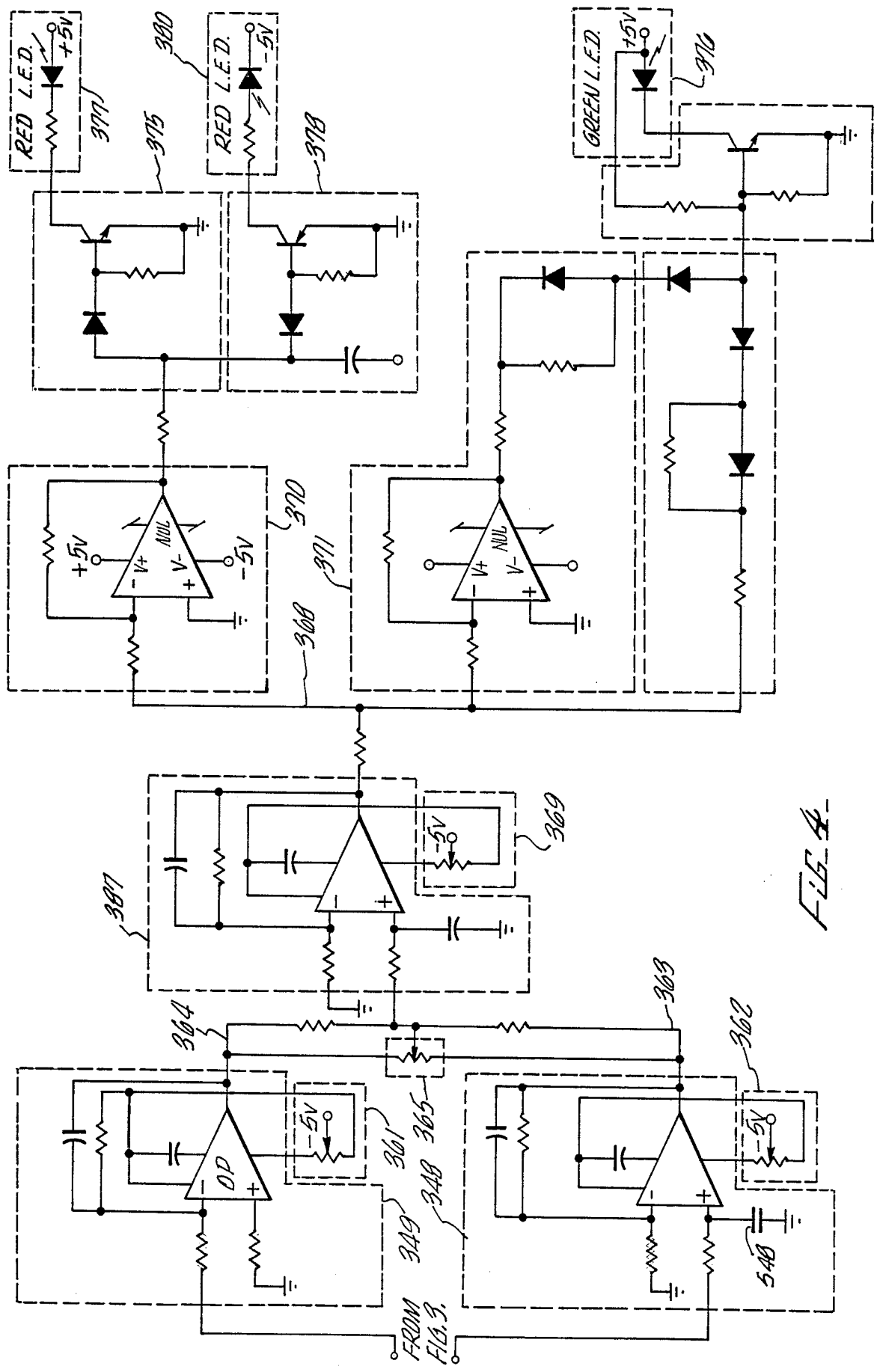

FIG. 3 and FIG. 4 are more detailed descriptions of the circuitry illustrated in the block diagram of FIG. 2. The magnetic sensor device 325 is shown connected through conductor 326 to instrument amplifier 341. The differential output of 341 is connected through conductor 343 to the differential input of 344. The unbalance output signal of 344 is connected via conductor 345 to the operational amplifier and low pass filter 346, the output of 346 is applied to half of relay 347, the output of this relay is fed into operational amplifier 351 which is a track and hold circuit. The output from 351 is fed into 353 operational amplifier and the output from 353 is fed into one line of 326. The output signal from 344 is fed through conductor 345 into half of relay 347. The output of the relay 347 is fed through conductor 360 to operational amplifier circuit 348 on FIG. 4; the signal on line 345 is fed into inverting amplifier 349.

The output signal of devices 348 and 349 are compared prior to being input to operational amplifier 367. The output of device 367 is fed into line 368 and into operational amplifier 370 and 371. Should the input signal to device 370 exceed ±250 mV, LED's 377 or 380 will turn on. Should the signal into line 368 be within ±200mV, the green LED 376 will turn on. Device bias control 390, reference voltage amplifier 387, DC bias amplifier transistor 389 and limiting resistor 392 are arranged to provide the magnetic sensor 325 with the necessary bias current as illustrated on FIG. 3.

Associated with the magnetic sensor assembly 325 is an current control adjustment element 501 which permits the manual or ootumatic adjustment of a balance current through the magnetic sensor 325 in order to bring the output of the magnetic sensor 325 to a value suitable for operation of DC amplifier 341.

The interrupter circuit 2000 of FIG. 5 is now described. The circuit includes a function select switch 200 which, when in the "test" position, causes an oscillator circuit 201 to produce a square wave signal with a frequence of one cycle every 12 seconds. The output signal from oscillator circuit 201 is fed into line 202 and into amplifier and time delay circuit 203. Two signals are outputted from circuit 203. One signal 361 is fed into line 362 as a synchronization signal 361. The other signal is delayed 200 milliseconds and is fed into line 205 to the input of switching relay 207. The synchronization signal thus leads the tracking signal signal by about 0.2 seconds. The signal present in line 205 is also fed to the yellow LED 206 to provide an indication of fault interruption cycle. Yellow LED 206 turns ON when the pulse from the oscillator 201 is positive to indicate that magnetic sensor 324 is monitoring for fault current, and is OFF when the pulse is zero, and the fault current circuit is open.

The output signal from a switching relay 207 is fed into line 209 and from there into dual switch relay 210. Attached to relay 210 are four resistors 110, 111, 112 and 113. Resistors 111 and 113 serve the pick up function to create the interrupt DC fault current: only one is connected to the DC line, and this is determined by a comparator circuit 215. Resistors 110, 111, 112 and 113 are 5K ohms. A power supply and zero reference circuit 211 is attached to the DC disribution line under test through lines 212 and 213. The output of network 211 is fed into line 214. This voltage is one-half of the voltage between battery lines 11 and 12.

The doulbel pole, two position switch 200 is used to control the return current of two 10K ohms station ground resistances in the station ground alarm system, and, secondly, the two internal 5K ohm resistors which are used to create the 1/12th Hz frequency ground fault current.

Operational amplifier-comparator 215 has two input lines; line 214 connects to the power supply and zero reference circuit 211. Line 216 connects to the comparator input 217, which input is connected to point 10 (FIG. 1). The output signal of circuit 215 is fed into line 218, which feeds into the input of amplifier circuit 219. The output of circuit 219 is fed into line 220 to the input of dual switching relay 210. The input signal of relay 210 determines which current limiting resistor 111 or 112 is selected from the DC main line to ground to complete circuit for fault leakage current that pases through the magnetic sensor assembly. Relay 210 selects resistor 110 or 113 to connect from the main line to one side of switching relay 207. The purpose of these resistors 110 or 113 is rapidly to discharge the stray capacitance of the DC distribution line.

FIG. 6 and FIG. 7 provide a more detailed circuit description of the interrupter. Integrated circuit 201 of FIG. 6 acts as a multivibrator with an output frequency of one cycle every 12 seconds. Other crystal oscillator circuits with a fundamental frequency of 6 megaHertz to provide output of 1/2 Hertz could be used if needed to replace the integrated circuit 201 and associate components.

The output of circuit 201 is fed into transistor Q3. From the collector of Q3, the synchronization signal 361 is outputted to the detector circuits, and the same output of 201 is fed into the transistor Q2, and from its collector into the interupter-switching relay 207.

An analog delay circuit comprising a resistor and capacitor is connected to the collector of Q2; and the outputs of relay 207 are connected to the dual switch relay 210 as illustrated on FIG. 6 and FIG. 7.

In FIG. 7, two resistors 701 and 702 and two zener diodes 703 and 704 form a power supply reduction circuit and a floating zero reference circuit 211. This zero reference circuit 211 and the reference signal from the center tap of elements 16 and 17 of FIG. 1 are inputted into operational amplifier 215. The output 218 of amplifier 215 turns transistor 219 ON or OFF depending on the comparator output signal. When transistor 219 is On, switch relay 210 connects resistor 113 to the center tap of one side or relay 210. When the transistor 219 is OFF resistors 111 and 112 are appropriately connected. The two center taps of dual switch 210 are inputted into switching relay 207. The center tap of relay 207 is fed into function select switch 200 which completes the ground fault circuit and the line capacitance discharge circuits. Associated with the interrupter circuit is a positive 5 volts regulated integrated circuit 230, FIG. 6.

FIG. 8 is a circuit block diagram for the regulated power supply. The external power source 600 is inputted into conductor 601 and routed to a power switch 602. When the power switch 602 is closed, the output of the switch is fed into line 603 and to a power transformer 604. The output of transformer 604 is fed into line 605 from there into a rectifier circuit 606. The output of the rectifier circuit 606 is fed into line 607 as an unregulated source fed into the +5 volts LED indicator circuit 601 and into all other circuits requiring an +10 volts unregulated power source.

The output of power transformer 604 is also fed into a capacitor coupling circuit 608 through conductor line 605, and the output of capacitors 608 is fed into line 609 and into rectifier circuit 610: The output of rectifier circuit 610 is fed into line 611 and from there to −5 volts regulator circuit 612. The output from −5 volts regulated circuit is fed into line 613 and into LED circuit 614 and into all circuits connected to line 613. A high voltage protection circuit 615 has an input connected to line 613 and an output connected to line 611.

FIG. 9 described in more detail the circuit of block diagram of FIG. 8. The power transformer 604 has an input connected to the main power source through the power switch 602. The output of this transformer 604 is fused by F1 and fed from there to a rectifier bridge D3 of rectifier circuit 606. The output of D3 is filtered with capacitors C8 and C1, and inputs into the +10 volts distribution system along line 607. The output of line 607 also feeds the LED circuit 616.

The output of the transformer 604 is also fed into the coupling capacitors C9 and C10 of circuit 608 and feeds from there to rectifiers diodes D4, D5, D6 and D7 of rectifier circuit 610. The DC output of the diodes D4, D5, D6 and D7 is filtered with capacitors C2 and C7, and inputs to regulator circuit 612. The output of 612 is fed into the DS2 of LED circuit 614 circuit and into the −5 volts distribution line 613 and the high voltage protection circuit 615.

In operation of the DC fault detector, the fault is first verifier by observing indicator 19 such as an alarm system or differential voltmeter (FIG. 1) located between the tapping point 18 and station ground 235. This indicates that a fault exist on the DC distribution bus, however the location is unknown. The interrupter-pulser 2000 is then turned on by closing switch 200. A magnetic current detector-sensing device 25 is designed to detect low lever fault currents of at least about +2 milliamps.

The sensing elements 25 are clamped over the conductors 13a, 13b, 14a, 14b, 15a, and 15b, respectively, optionally after verfying with meter 19 that a fault exists. Thereupon the input offset adjust and center bias detector 342 (FIGS. 2, 3 and 4) is adjusted so as effectively to render the sensors 24 operational.

In FIG. 1, the isolation and detection of the fault current to the circuit 13a, 13b, or 14a or 14b or 15a or 15a is determined by a response to the pulsed input signal by either the LED, buzzer, or meter which constitutes the indicator means of the detector 24 in the respective branch having a ground fault. In the example illustrated the response will be in the branch line 14a or 14b in view of the ground fault 23. The detector-circuit 125 of detector 24 will pass interrupted ground fault current as generated by the interrupter pulser 2000 which opens and closes in the ground circuit. The detector in the detector 24 responds accordingly. In those circuits where there is no ground fault there is no indicator response in the detector 24.

In the circuitry of FIGS. 2, 3, and 4, there is a green LED 376 response in the sensor 24. The indicated response for a ground fault output is repeatedly indicated at about 12 second intervals. In the circuitry of FIGS. 2, 3, and 4, there is a red LED 377 or LED 380 response dependent on the ground fault current direction or line.

In some cases, by moving the detector 25 along the conductors 14a and 14b to a point where the ground fault signal ceases to be detected by the sensor there is provided means for detecting the actual location of the ground fault. The detector 25 in fact need be placed only abount either conductor 14a or 14b to located more precisely the location of the fault.

Detectors 25 can be permanently located at discreet points. Moveover, an interrupter can also be permanently in circuit such that on the occurrence of a ground fault, one or more detectors respond thereby enabling the location of the ground fault.

Essentially, the apparatus amd method of the invention ensures that the normally ungrounded DC system can remain operational in respect of the ungrounded loads and this prevents expensive and unnecessary down time for system which must continue opertion while suffering ground fault problems and also during detection of those problems.

The features of the detector of the invention include the additional following aspects. The detector can be located as a solid state rack mountable device with multiple independent channels for ground fault detection for different feeders in a multi-feeder system. The detector has a capability of detecting ground faults from zero up to 40,000 ohms on a 130 volt DC system, but not limited to. Having a capacitive reactance of a 100 microfarad, the system itseft operates to interrupt a simulated fault current at a frequency of about 1/12 Hz. In some cases the frequency range is from a low range of about 1/100 Hz to a higher frequency of several hundred Hz. The frequency chosen will depend on the nature of the system in which the fault is being detected, and particularly on the capacitive reactance of that system.

The sensor and associated circuitry permit for the detection of low levels of DC ground fault current, namely, the fault current which has a magnetic component detection magnitude approximately 1/20 of the earth's magnetic field intensity and also lower in magnitude than the surrounding electromagnetic and electrostatic fields As such, the detector is virtually immune to high level environmental fields and their changes. Moreover, the detector can simultaneously detect more than one ground in a multi-feeder DC distribution system.

Many changes and variations may be made in the apparatus and method providing widely different embodiments in applications for this invention without departing from scope thereof. All matter contained in tha above description as shown in the accompanyinmg drawings should be interpreted as illustrative and not limiting. For instance, in one other forms of the invention, the detection of AC faults in an AC single phase systems is possible. Similarly, faults in a grounded DC system can be detected. When ground faults are detected, the precondition of the system may have to be monitored so that deviations from the precondition can be determined as a fault by the detection system. Suitable microprocessors can be used to determined such conditions if necessary.

Also, although the ungrounded DC system has been described with limiting resistors 16 and 17 and the indicator means 19, it should be clear that these are not necessarily employed. Resistors 110, 111, 112 and 113 appropriately effect the requisite limiting resistance as described.

The invention is to be interpreted solely by the scope of the appended claims.

What is claimed is:

1. Apparatus for the detection of a fault signal in a supply system including conductors from a supply for supplying power to a load connected in the system comprising an impedance element for connection across the power supply, a tapping point to the impedance element, a connector between the tapping point and a point to complete a circuit for a fault signal in the system, an interrupter for periodically pulsing a signal into the system effectively thereby to generate a pulse interrupted fault signal, a detector for location relative to the system for sensing the pulse interrupted fault signal and thereby providing for detecting the location of the fault, and means for operating the detector in synchronism with the interrupter whereby the detector senses a substantially steady state level of the pulse interrupted fault signal.

2. Apparatus as claimed in claim 1 wherein the system is a DC system and the pulse is a DC pulse.

3. Apparatus as claimed in claim 2 wherein the DC pulse level is sensed at a time removed from the time of change of the pulse interrupted signal.

4. Apparatus as claimed in claim 3 wherein the interrupted pulse is substantially a square wave and the detection is effected during the steady state high level of the square wave.

5. Apparatus as claimed in anyone of claims 1, 2, 3 or 4 wherein the interrupter generates a synchronization signal, and including means for feeding the synchronization signal to the detector.

6. Apparatus as claimed in anyone of claims 1, 2, 3 or 4 including a crystal oscillator for generating a synchronization signal, and means for feeding such signal to the detector.

7. Apparatus as claimed in anyone of claims 1, 2, 3 or 4 wherein the detector includes a magnetic sensor for location about a positive and a negative conductor of the conductors between the power supply and load, and including means for determining whether the fault signal is in the positive and/or negative conductor between the power supply and load.

8. Apparatus as claimed in claim 4 wherein the period of the square wave is about 12 seconds.

9. Apparatus as claimed in claim 1 including means for eliminating the effect of electromagnetic changes in the system prior to sampling and measuring the steady state interrupted pulse.

10. Apparatus as claimed in claim 1 including means for detecting fault signals at least as low 2 milliamperes.

11. Apparatus as claimed in claim 1 including means for detecting a fault signal less than 2 milliamperes.

12. Apparatus for the detection of a fault signal in a supply system including conductors from a power supply for supplying power to a load and having stray capacitance in the system comprising an impedance element for connection across the power supply, a tapping point to the impedance element, a connector between the tapping point and a point to complete a circuit for a fault signal in the system, an interrupter for periodically pulsing a signal into the system effectively thereby to generate a pulse interrupted fault signal, a detector for location relative to the system for sensing the pulse interrupted fault signal and thereby providing for detecting the location of the fault, and including means for substantially discharging the stray capacitance in the system.

13. Apparatus as claimed in claim 12 wherein the power supply is a DC power supply and the pulse is a DC pulse, and wherein the detector is a magnetic detector and detection is effected after the stray capacitance in the system has been substantially fully charged or discharged.

14. Apparatus as claimed in claim 13 wherein the discharging means includes a resistor bank for selective connection across the power supply.

15. Apparatus as claimed in claim 14 wherein the resistor bank is part of the impedance element and includes four resistors, a pair of resistors being connected to each conductor, and including a switch between at least some of the resistors whereby in one position of the switch a first resistor is connected with one conductor and another resistor is connected with second conductor, and in a second position of the switch a third resistor is connected with the first conductor, and a fourth resistor is connected with the second conductor.

16. Apparatus as claimed in claim 15 wherein in the second position of the switch at least one of the resistors acts to discharge stray capacitance while in the first position at least one of the resistors acts as a current limiting resistor.

17. Apparatus as claimed in claim 16 wherein the value of the discharge resistor is determined to be substantially equal to the current limiting resistor such that the time constant to charge the circuit is substantially equal to the time constant to discharge the circuit.

18. Apparatus as claimed in claim 17 wherein the cycle for interrupting the circuit is about 12 seconds, and wherein about 6 seconds is for the fault signal to flow thorugh the limiting resistor and about 6 seconds is for the stray capacitance to discharge through the discharge resistor.

19. Apparatus as claimed in claim 18 including means for detecting a fault signal as low as about 2 milliamperes.

20. Apparatus for the detection of a ground fault signal in a normally ungrounded DC system including conductors from a supply for supplying power to a load in the DC system comprising an impedance element for connection across the DC power supply, a tapping point to the impedance element, a connector between the tapping point and a ground point to complete a ground circuit for a ground fault in the system, a relay between the tapping point and ground, an interrupter for periodically opening and closing the relay while the ungrounded DC system remains substantially closed and operational, the opening and closing of the relay interrupting the ground circuit effectively thereby to generate a DC pulse interrupted ground fault signal, a magnetic detector for location relative to the DC system for sensing the DC pulse interrupted ground fault signal and thereby providing for detecting the location of the ground fault, the DC system remaining substantially closed and operational during the ground fault detection, and means for operating the detector in synchronism with the interrupter whereby the detector senses a substantially steady state level of the DC pulse interrupted fault signal.

21. Apparatus as claimed in claim 20 wherein the DC pulse level is sensed at a time removed from the time of change of the interrupted signal.

22. Apparatus as claimed in claim 21 wherein the interrupted pulse is substantially a square wave and the detection is effected during the steady state high level of the square wave.

23. Apparatus as claimed in anyone of claims 20, 21 or 22 wherein the interrupter generates a synchronization signal, and including means for feeding the synchronization signal to the detector.

24. Apparatus as claimed in anyone of claims 20, 21 or 22 including a crystal oscillator for generating a synchronization signal, and means for feeding the synchronization signal to the detector.

25. Apparatus as claimed in anyone of claims 20, 21 or 22 wherein the detector means includes a sensor for location about a positive and a negative conductor of the conductors between the power supply and load, and including means for determining whether the fault signal is in the positive and/or negative conductor between the power supply and load.

26. Apparatus as claimed in claim 22 wherein period of the square wave is about 12 seconds.

27. Apparatus as claimed in claim 20 including means for eliminating the effect of electromagnetic changes in the system prior to sampling and measuring the steady state interrupted pulse.

28. Apparatus as claimed in claim 20 including means for detecting ground fault signal at least as low as 2 milliamperes.

29. Apparatus as claimed in claim 20 including means for detecting a ground fault signal less than 2 milliamperes.

30. Apparatus for the detection of a ground fault signal in a normally ungrounded DC system including conductors from a supply for supplying power to loads in the DC system having stray capacitance comprising an impedance element for connection across the D.C. power supply, a tapping point to the impedance element, a connector between the tapping point and a ground point such that a ground fault in the system completes a ground circuit, a relay between the tapping point and ground, an interrupter for periodically opening and closing the relay while the ungrounded DC system remains substantially closed and operational, the opening and closing of the relay interrupting the ground circuit effectively thereby to generate a DC pulse interrupted ground fault signal, a magnetic detector for location relative to the DC system for sensing the DC pulse interrupted ground fault signal and thereby providing for detecting the location of the ground fault, the DC system remaining substantially closed and operational during the ground fault detection, and including means for substantially discharging the stray capacitance in the system.

31. Apparatus as claimed in claim 30 wherein the discharging means includes a resistor bank for selective connection across the power supply, and detection is effected after the stray capacitance in the system has been substantially fully charged or discharged.

32. Apparatus as claimed in claim 31 wherein the resistor bank is part of the impedance element and includes four resistors, a pair of resistors being connected to each conductor, and including a switch between at least some of the resistors whereby in one position of the switch a first resistor is connected with one conductor and another resistor is connected with a second conductor, and in a second position of the switch a third resistor is connected with the first conductor, and a fourth resistor is connected with the second conductor.

33. Apparatus as claimed in claim 32 wherein the second position of the switch connects at least one of the resistors to discharge stray capacitance, while in the first position at least one of the resistors acts as a current limiting resistor.

34. Apparatus as claimed in claim 33 wherein the value of the discharge resistor is determined to be substantially equal to the current limiting resistor such that the time constant to charge the circuit is substantially equal to the time constant to discharge the circuit.

35. Apparatus as claimed in claim 34 wherein the cycle for interrupting the circuit is about 12 seconds, and wherein about 6 seconds is for fault signal to flow through the limiting resistor and about 6 seconds is for the stray capacitance to discharge through the discharge resistor.

36. Apparatus as claimed in claim 35 including means for detecting a fault signal as low as about 2 milliamperes.

37. Apparatus for the detection of low level ground leakage current in a supply system including conductors from a supply for supplying power to a load connected in the system comprising:
  resistor elements for connection at one end to conductors from the supply;
  a selector relay connected to the resistors at ends opposite to the connection with the conductors;
  an interrupter replay connected with the selector relay for periodically connecting selected resistor elements to ground thereby creating a ground circuit for the ground leakage current through selected resistors; and
  a detector for location relative to the system for sensing the ground current when the current is in a substantially steady state level.

38. Apparatus as claimed in claim 37 including delay means for operating the detector before the interrupter interrupts the ground circuit.

39. Apparatus as claimed in claim 38 including means for generating a synchronous signal, the synchronous signal activating the interrupter and activating the detector through the delay means.

40. Apparatus as claimed in anyone of claims 1, 2, 3, 4, 20, 21, or 22 including means for synchronizing the detector to operate in time advance of the pulse interrupted signal.

41. Apparatus as claimed in claim 5 wherein the synchronization signal leads in time the interrupted pulse signal.

42. Apparatus as claimed in claim 5 including means for delaying in time the interrupted pulse signal relative to the synchronization signal.

43. Apparatus as claimed in claim 40 wherein the time advance is about 200 milliseconds.

44. Apparatus as claimed in anyone of claims 12, 13, 14, 15, 16, 17, 30, 31, 32, 33 or 34 including means for synchronizing the detector to operate in synchronization with the interrupter whereby the detector senses a substantially steady state level of the pulse interrupted fault signal.

45. Apparatus as claimed in claim 44 including means for synchronizing the detector to operate in time advance of the pulse interrupted signal.

46. Apparatus as claimed in claim 45 including means for generating a synchronization signal leading in time of the interrupted pulse signal.

47. A method for the detection of a fault signal in a system including conductors from a supply for supplying power to a load connected in the system comprising connecting an impedance element across the power supply, providing a tapping point to the impedance element to complete a circuit between the tapping point and a point for a fault signal in the system, periodically interrupting the system with a pulsing signal thereby to generate a pulse interrupted signal in the system, and detecting the location relative to the system of the pulse interrupted signal, the detection being in synchronism with the interrupting signal whereby the detection is effected at substantially steady state level of the pulse interrupted signal.

48. A method as claimed in claim 47 wherein the system is a DC system and including detecting a DC pulse.

49. A method as claimed in claim 48 including sensing the DC pulse level at a time removed from the time of change of the interrupted signal.

50. A method as claimed in claim 49 including generating an interrupted pulse which is substantially a square wave, and effecting detection during the steady state high level of the square wave.

51. A method as claimed in anyone of claims 47 to 50 including generating a synchronization signal, and feeding the synchronization signal to a detector.

52. A method as claimed in anyone of claims 47 to 50 including generating a synchronization signal from a resistor/capacitor oscillator or a crystal oscillator and feeding such signal to a detector.

53. A method as claimed in anyone of claims 47 to 50 including sensing the fault current in a positive and/or negative conductor between the power supply and load.

54. A method as claimed in claim 50 wherein the period of the square wave is about 12 seconds.

55. A method as claimed in claim 47 including eliminating the effect of electromagnetic changes in the system prior to sampling and measuring the steady state of the pulse interrupted signal.

56. A method as claimed in claim 47 including detecting fault signals at least as low as 2 milliamperes.

57. A method for the detection of a fault signal system including conductors from a supply for supplying power to a load in the system having stray capacitance comprising connecting an impedance element across the power supply, providing a tapping point to the impedance element to complete a circuit between the tapping point and a point for a fault signal in the system periodically interrupting the system with a pulsing signal effectively thereby to generate a pluse interrupted fault signal, detecting the location relative to the system of the pulse interrupted signal and thereby providing for detecting the location of the fault, and substantially charging or discharging substantially the stray capacitance prior to detection of a fault in the system.

58. A method as claimed in claimed in claim 57 including selectively connecting a resistor bank across the power supply for discharging the stray capacitance.

59. A method as claimed in claim 58 wherein the resistor bank includes four resistors and connecting a pair of resistors to each conductor, and including switching between at least some for the resistors whereby in one position of the switch a first resistor whereby in one position of the switch a first resistor is connected with one conductor and another resistor is connected with a second conductor, and in a second position connecting a third resistor with the first conductor, and a fourth resistor with a second conductor.

60. A method as claimed in claim 59 including switching in a second position at least one of the resistors to discharge stray capacitance, and while in the first position at least one of the resistors acts to limit current.

61. A method as claimed in claim 60 including selecting the value of the discharge resistor to be substantially equal to the current limiting resistor such that the time constant to charge the circuit is substantially equal to the time constant to discharge the circuit.

62. A method as claimed in claim 61 including interrupting the circuit with a cycle time of about 12 seconds, and wherein about 6 seconds is for the fault signal to flow through the limiting resistor and about 6 seconds is for the stray capacitance to discharge through the discharge resistor.

63. A method as claimed in claim 62 including detecting a fault signal about as low as 2 milliamperes.

64. A method for the detection of a ground fault signal in a normally ungrounded DC system including conductors from a supply for supplying power to a load in the DC system comprising connecting an impedance element across the DC power supply, providing a tapping point to the impedance element to complete a circuit between the tapping point and a ground point for a ground fault signal in the system having a relay between the tapping point and ground, periodically opening and closing the relay while the ungrounded DC system remains substantially closed and operational, the opening and closing of the relay interrupting the ground circuit effectively thereby to generate a DC pulse interrupted ground fault signal, and magnetically detecting the location relative to the DC system of the DC pulse interrupted ground fault signal and thereby providing for detecting the location of the ground fault, the detection being in synchronism with the interrupting signal whereby the detection is at a substantially steady state level of the DC pulse interrupted ground fault.

65. A method as claimed in claim 64 including generating an synchronization signal, and feeding the synchronization signal to the detector.

66. A method for detecting a ground fault signal in a normally ungronded DC system having conductors from a supply for supplying power to loads in the DC system with stray capacitance comprising connecting an impedance element across the DC power supply, providing a tapping point to the impedance element to complete a circuit between the tapping point and a ground point for the ground fault, providing a relay between the tapping point and ground, periodically opening and closing the relay while the ungrounded DC system remains substantially closed and operational, the opening and closing of the relay interrupting the ground circuit effectively thereby to generate a DC pulse interrupted ground fault signal, magnetically detecting the DC pulse interrupted ground fault signal and thereby providing for detecting the location of the ground fault, and substantially charging or discharging the stray capacitance prior to detection of DC pulse interrupted ground fault in the system.

67. A method as claimed in claim 66 including synchronizing detection to operate in time lag of the pulse interrupted signal.

68. A method as claimed in claim 67 including generating a synchronization signal to lead in time the interrupted pulse signal.

69. A method as claimed in claim 68 wherein the time lag is about 200 milliseconds.

70. A method as claimed in claim 69 including synchronizing the detector to operate in synchronism with the interrupter pulse whereby the detector senses a substantially steady state pulse level.

71. Apparatus as claimed in claim 14 wherein the resistor bank is part of the impedance element and includes four resistors, a pair of resistors being connected to each conductor, and including a switch between at least some of the resistors whereby the switch selectively connects each resistor in turn to complete the circuit for the fault system.

72. Apparatus as claimed in claim 71 wherein one resistor discharges stray capacitance and another resistor limits current.

73. Apparatus as claimed in claim 72 wherein the value of the discharge resistor is determined such that the time constant to charge the circuit is substantially equal to the time constant to discharge the circuit, interrupting the circuit is about 12 seconds.

74. A method as claimed in claim 73 including having the resistor bank contain four resistors and connecting a pair of resistors to each conductor, and including switching between at least some of the resistors whereby, in turn, a first resistor is connected with one conductor and another resistor is connected with a second conductor, and then a third resistor is connected with the first conductor, and a fourth resistor is connected with a second conductor.

75. A method as claimed in claim 74 including selectively switching resistors to discharge stray capacitance, and to limit current.

76. A method as claimed in claim 75 including selecting the value of the discharge resistor such that the time constant to charge the circuit is substantially at least equal or greater than the time constant to discharge the circuit.

77. Apparatus as claimed in claim 30 wherein the resistor bank is part of the impedance element and includes four resistors, a pair of resistors being connected to each conductor, and including a switch between at least some of the resistors whereby the switch selectively connects each resistor in turn to complete the circuit for the fault signal.

78. Apparatus as claimed in claim 77 wherein different resistors act to discharge stray capacitance and limit current.

79. Apparatus for the detection of low level ground leakage in a supply system including conductors from the supply for supplying power to loads connecting to the system comprising:
  resistor elements connected at one end to conductors from the supply;
  a selector relay connected to the resistors at ends opposite to the resistor connection with the conductors;
  an interrupter relay connected with the selector relay for periodically connecting selected resistor elements through a function switch to ground thereby creating a ground circuit for ground leakage current through the selected resistors when the function switch is closed; and
  a detector for location relative to the conductors for sensing the ground leakage current when the ground current is at a substantially steady state level.

80. Apparatus as claimed in claim 79 wherein the interrupter relay acts to cause the ground circuit to be periodically interrupted thereby to generate a pulse interrupted ground fault current.

81. Apparatus as claimed in claim 80 wherein the pulse interrupted ground fault current has a period of about 12 seconds.

82. Apparatus as claimed in claim 80 including delay means for operating the detector before the interrupter interrupts the ground circuit.

83. Apparatus as claimed in claim 82 including means for generating a synchronized signal, the synchronized signal activating the interrupter relay and activating the delay means.

84. Apparatus as claimed in claim 83 wherein the delay means causes the detector to sense the ground leakage current after a substantially steady state level is reached.

85. Apparatus as claimed in claim 84 wherein the delay is sufficient in time so that stray capacitive components in the system are substantially charged whereby the detector senses a current level substantially unaffected by stray capacitance.

86. Apparatus as claimed in claim 85 wherein the pulse interrupted ground fault current has a period of about 12 seconds.

87. Apparatus as claimed in claim 86 wherein the resistor elements include four resistors, the one end of a pair of resistors being connected to a first conductor and the one end of another pair of resistors being connected to a second conductor, and wherein the selector relay in turn connects the interrupter relay and function switch through different resistors of the pairs to complete the ground circuit.

88. Apparatus as claimed in claim 87 wherein the different resistors act to discharge stray capacitance to limit current in the system.

89. Apparatus as claimed in claim 88 wherein the resistor elements include discharge resistors and the value of the discharge resistors is determined such that the time constant to charge the system is substantially equal to the time constant to discharge the system.

90. A method for the detection of low level ground leakage current in a supply system including conductors between a supply loads connected in the system comprising:
  connecting one end of resistor elements to the conductors from the supply;
  connecting a selector relay to the resistors at ends opposite to the resistor connection with the conductors; connecting an interrupter relay with the selector relay for periodically connecting selector relay and through a function switch to ground thereby creating a ground circuit for the ground leakage current through selected resistors when the function switch is closed; and
  locating a detector relative to the system for sensing the ground leakage current when the current is at a substantially steady state level.

91. A method as claimed in claim 90 including periodically interrupting the group circuit with the interrupter relay thereby to generate a pulse interrupted ground fault current.

92. A method as claimed in claim 91 wherein the pulse current has a period of about 12 seconds.

93. A method as claimed in claim 92 including a delay period for operating the detector before the interrupter interrupts the ground circuit.

94. A method as claimed in claim 93 including generating a synchronous signal for activating the interrupter and for activating the detector before the delay period.

95. A method as claimed in claim 94 wherein the delay period causes the detector to sense the ground current after substantially steady state is reached.

96. A method as claimed in claim 95 wherein the delay period is sufficient so that the stray capacitance of the system is substantially charged.

97. Apparatus as claimed in claim 39 wherein the delay means causes the detector to sense the ground current after a substantially steady state is reached.

98. Apparatus as claimed in claim 97 wherein the time delay permits the stray capacitance in the system to be substantially charged prior to the detector detecting the ground current.

* * * * *